US009865458B2

(12) United States Patent
Yamamoto et al.

(10) Patent No.: US 9,865,458 B2
(45) Date of Patent: *Jan. 9, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Ryuji Yamamoto, Toyama (JP); Yoshiro Hirose, Toyama (JP); Satoshi Shimamoto, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/347,347

(22) Filed: Nov. 9, 2016

(65) Prior Publication Data

US 2017/0117133 A1   Apr. 27, 2017

Related U.S. Application Data

(63) Continuation of application No. 15/010,682, filed on Jan. 29, 2016, now Pat. No. 9,524,867.

(30) Foreign Application Priority Data

Jan. 29, 2015 (JP) ................................ 2015-016083

(51) Int. Cl.
 *H01L 21/02*   (2006.01)
 *C23C 16/40*   (2006.01)
 (Continued)

(52) U.S. Cl.
 CPC ........ *H01L 21/0228* (2013.01); *C23C 16/401* (2013.01); *C23C 16/4412* (2013.01);
 (Continued)

(58) Field of Classification Search
 CPC .......... H01L 21/0226; H01L 21/02334; H01L 21/02518; H01L 21/285
 See application file for complete search history.

(56) References Cited

U.S. PATENT DOCUMENTS

2011/0065289 A1   3/2011   Asai
2011/0076789 A1   3/2011   Kuroda
(Continued)

FOREIGN PATENT DOCUMENTS

JP   2014-183218 A     9/2014
KR   10-2011-0029080 A   3/2011
(Continued)

OTHER PUBLICATIONS

Office Action issued in corresponding Korean Patent Application No. 10-2016-0011472 dated Mar. 16, 2017, consisting of 14 pp. (Machine Translation Provided).

*Primary Examiner* — Cheung Lee
(74) *Attorney, Agent, or Firm* — Volpe and Koenig, P.C.

(57) ABSTRACT

A method of manufacturing a semiconductor device includes forming a film on a substrate by performing a cycle a predetermined number of times. The cycle includes non-simultaneously performing: forming a first layer by supplying a precursor gas including a chemical bond of a first element and carbon and a first catalyst gas to the substrate; exhausting the precursor gas and the first catalyst gas through an exhaust system; forming a second layer by supplying a reaction gas including a second element and a second catalyst gas to the substrate to modify the first layer; and exhausting the reaction gas and the second catalyst gas through the exhaust system. At least in a specific cycle, the respective gases are supplied and confined in the process chamber while closing the exhaust system in at least one of the act of forming the first layer and the act of forming the second layer.

12 Claims, 13 Drawing Sheets

(51) Int. Cl.
*C23C 16/455* (2006.01)
*C23C 16/44* (2006.01)

(52) U.S. Cl.
CPC .. *C23C 16/45529* (2013.01); *C23C 16/45531* (2013.01); *C23C 16/45534* (2013.01); *C23C 16/45546* (2013.01); *C23C 16/45553* (2013.01); *C23C 16/45557* (2013.01); *H01L 21/02126* (2013.01); *H01L 21/02167* (2013.01); *H01L 21/02211* (2013.01); *H01L 21/02334* (2013.01); *H01L 21/0214* (2013.01); *H01L 21/0217* (2013.01)

(56) References Cited

U.S. PATENT DOCUMENTS

2013/0171838 A1* 7/2013 Okuda ............... H01L 21/0217
 438/778
2014/0287596 A1* 9/2014 Hirose ............... H01L 21/022
 438/786

FOREIGN PATENT DOCUMENTS

KR 10-2011-0034538 A 4/2011
KR 10-2013-0038137 A 4/2013

* cited by examiner

FIG. 12A

| Name | Pyridine | Aminopyridine | Picoline | Lutidine | Piperazine | Piperidine |
|---|---|---|---|---|---|---|
| Composition formula | $C_5H_5N$ | $C_5H_6N_2$ | $C_6H_7N$ | $C_7H_9N$ | $C_4H_{10}N_2$ | $C_5H_{11}N$ |
| Structural formula | | | | | | |
| Acid dissociation constant (pKa) | 5.67 | 6.89 | 6.07 | 6.96 | 9.80 | 11.12 |

FIG. 12B
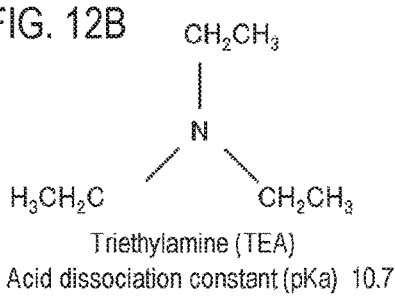
Triethylamine (TEA)
Acid dissociation constant (pKa) 10.7

FIG. 12C
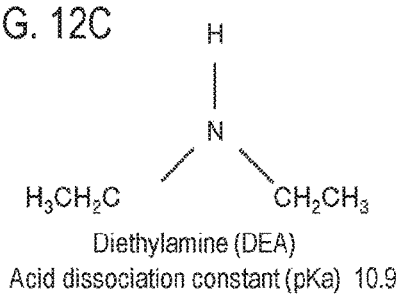
Diethylamine (DEA)
Acid dissociation constant (pKa) 10.9

FIG. 12D
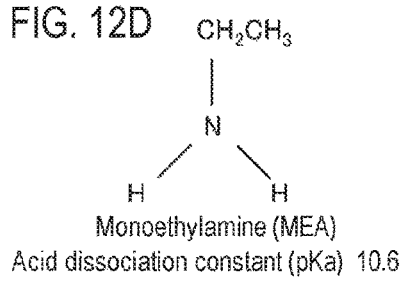
Monoethylamine (MEA)
Acid dissociation constant (pKa) 10.6

FIG. 12E
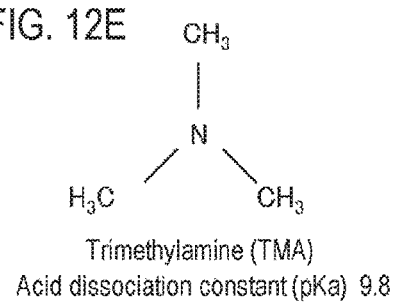
Trimethylamine (TMA)
Acid dissociation constant (pKa) 9.8

FIG. 12F
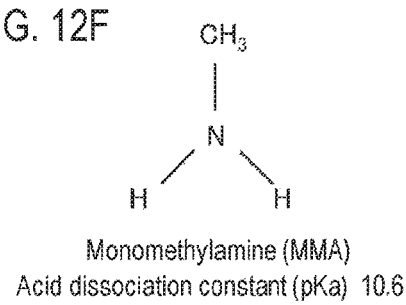
Monomethylamine (MMA)
Acid dissociation constant (pKa) 10.6

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a continuation of Ser. No. 15/010,682, filed Jan. 29, 2016, which claims the benefit of priority from Japanese Patent Application No. 2015-016083, filed on Jan. 29, 2015, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a process of supplying a precursor gas and a reaction gas to a substrate and forming a film on the substrate is often carried out.

SUMMARY

The present disclosure provides some embodiments of a technique capable of enhancing the productivity of a film forming process and improving the controllability of a composition ratio of a formed film when a film is formed on a substrate using a precursor gas and a reaction gas.

According to one embodiment of the present disclosure, there is provided a technique which includes forming a film including a first element, a second element and carbon on a substrate by performing a cycle a predetermined number of times, the cycle including non-simultaneously performing:

forming a first layer by supplying a precursor gas including a chemical bond of the first element and carbon and a first catalyst gas to the substrate in a process chamber;

exhausting the precursor gas and the first catalyst gas in the process chamber through an exhaust system;

forming a second layer by supplying a reaction gas including the second element and a second catalyst gas to the substrate in the process chamber to modify the first layer; and exhausting the reaction gas and the second catalyst gas in the process chamber through the exhaust system, wherein at least in a specific cycle when performing the cycle the predetermined number of times, the respective gases are supplied and confined in the process chamber while closing the exhaust system in at least one of the act of forming the first layer and the act of forming the second layer.

BRIEF DESCRIPTION OF THE DRAWINGS

FIG. 12A is a view illustrating chemical structural formulae of cyclic amine, FIG. 12B is a view illustrating a chemical structural formula of TEA which is chain amine, FIG. 12C is a view illustrating a chemical structural formula of DEA which is chain amine, FIG. 12D is a view illustrating a chemical structural formula of MEA which is chain amine, FIG. 12E is a view illustrating a chemical structural formula of TMA which is chain amine, and FIG. 12F is a view illustrating a chemical structural formula of MMA which is chain amine.

DETAILED DESCRIPTION

One Embodiment of the Present Disclosure

One embodiment of the present disclosure will now be described with reference to FIGS. 1 to 3.

(1) Configuration of Substrate Processing Apparatus

Figure 1:
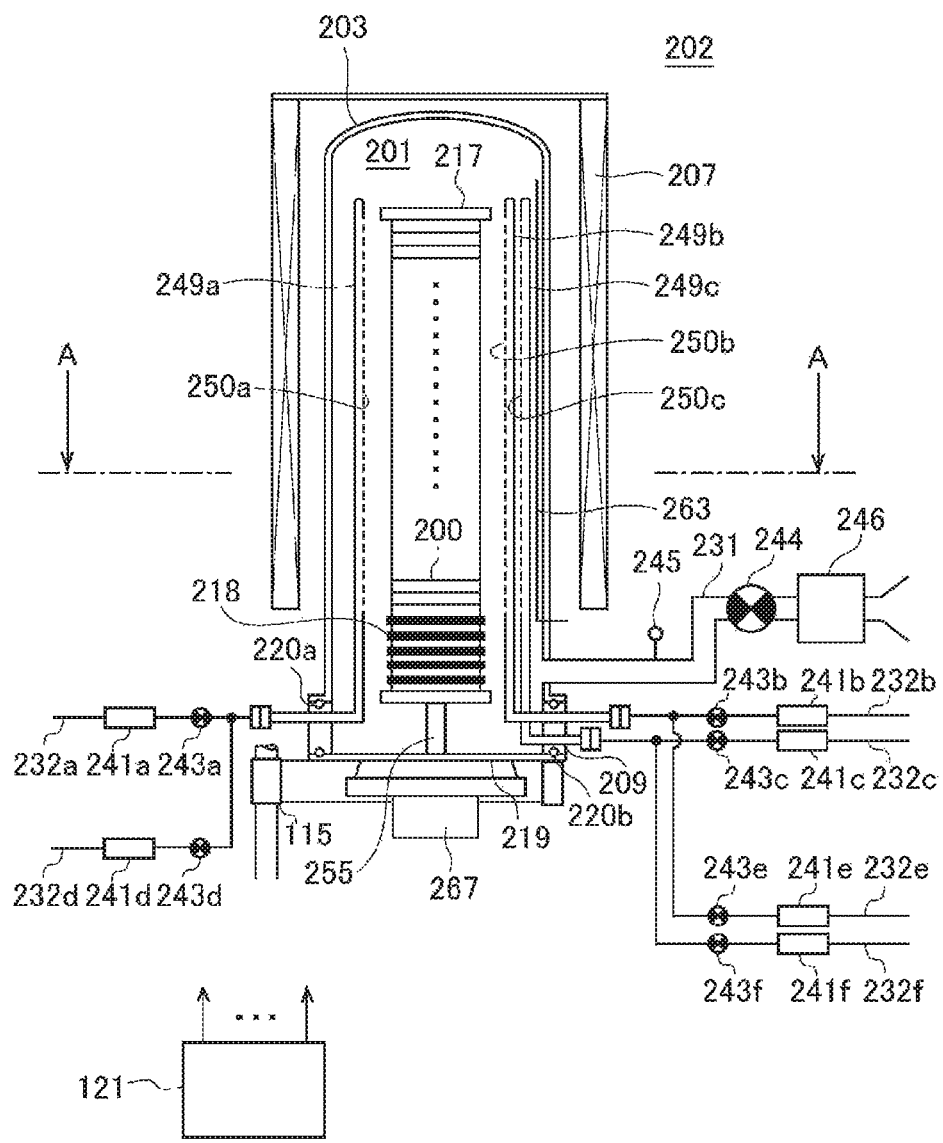
FIG. 1 is a schematic configuration view of a vertical processing furnace of a substrate processing apparatus suitably used in one embodiment of the present disclosure, in which a portion of the processing furnace is shown in a vertical cross section.
Figure 2:
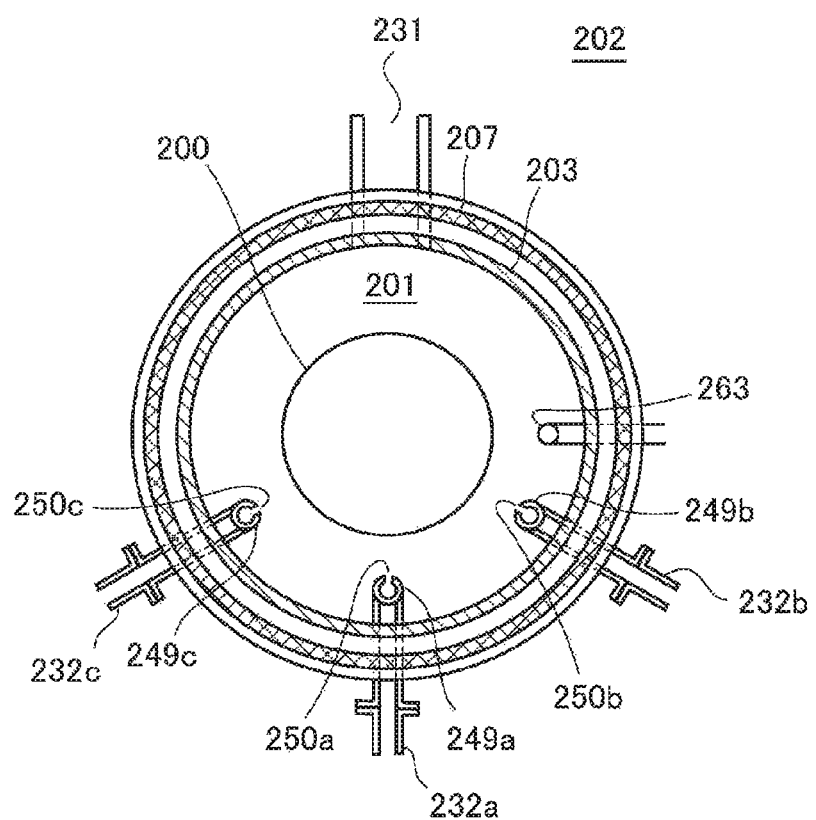
FIG. 2 is a partial schematic configuration view of the vertical processing furnace of the substrate processing apparatus suitably used in one embodiment of the present disclosure, in which a portion of the processing furnace is shown in a cross section taken along line A-A in FIG. 1.

As shown in FIG. 1, a processing furnace 202 includes a heater 207 as a heating part (a heating mechanism). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

A reaction tube 203 is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A manifold (inlet flange) 209 is disposed below the reaction tube 203 in a concentric relationship with the reaction tube 203. The manifold 209 is made of metal, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. The manifold 209 is supported by the heater base. Thus, the reaction tube 203 comes into a vertically mounted state. A processing vessel (reaction vessel) is mainly configured by the reaction tube 203 and the manifold 209. A process chamber 201 is formed in a hollow cylindrical portion of the processing vessel. The process chamber 201 is configured to accommodate a plurality of wafers 200 as substrates. The wafers 200 are horizontally stacked at multiple stages along a vertical direction in a boat 217 which will be described later.

Nozzles 249a to 249c are installed in the process chamber 201 so as to penetrate through the manifold 209. The nozzles 249a to 249c are made of, e.g., a heat resistant material such as quartz, SiC or the like. Gas supply pipes 232a to 232c are respectively connected to the nozzles 249a to 249c. In this way, the three nozzles 249a to 249c and the three gas supply pipes 232a to 232c are installed in the reaction tube 203 and are capable of supplying plural kinds of gases into the process chamber 201.

Mass flow controllers (MFC) 241a to 241c, which are flow rate controllers (flow rate control parts), and valves 243a to 243c, which are opening/closing valves, are installed in the gas supply pipes 232a to 232c sequentially from the corresponding upstream sides. Gas supply pipes 232d to 232f, which supply an inert gas, are respectively connected to the gas supply pipes 232a to 232c at the downstream side of the valves 243a to 243c. MFCs 241d to 241f, which are flow rate controllers (flow rate control parts), and valves 243d to 243f, which are opening/closing valves, are installed in the gas supply pipes 232d to 232f sequentially from the corresponding upstream sides.

The nozzles 249a to 249c are respectively connected to end portions of the gas supply pipes 232a to 232c. As shown in FIG. 2, the nozzles 249a to 249c are disposed in an annular space between the inner wall of the reaction tube 203 and the wafers 200 such that the nozzles 249a to 249c extend upward along an arrangement direction of the wafers 200 from a lower portion of the inner wall of the reaction tube 203 to an upper portion thereof. Specifically, the nozzles 249a to 249c are installed along a wafer arrangement region in which the wafers 200 are arranged and in a region that horizontally surrounds the wafer arrangement region at a side of the wafer arrangement region. That is to say, the nozzles 249a to 249c are respectively installed in a perpendicular relationship with the surfaces (flat surfaces) of the wafers 200 at a lateral side of the end portions (peripheral edge portions) of the wafers 200 carried into the process chamber 201. Each of the nozzles 249a to 249c is configured as an L-shaped long nozzle. A horizontal portion of each of the nozzles 249a to 249c is installed to penetrate a sidewall of the manifold 209. A vertical portion of each of the nozzles 249a to 249c is installed to extend upward at least from one end portion of the wafer arrangement region toward the other end portion thereof. A plurality of gas supply holes 250a to 250c for supplying a gas is respectively formed on the side surfaces of the nozzles 249a to 249c. Each of the gas supply holes 250a to 250c is opened toward the center of the reaction tube 203 to allow the gas to be supplied toward the wafers 200. The gas supply holes 250a to 250c may be formed in a plural number so as to span from the lower portion of the reaction tube 203 to the upper portion thereof. The respective gas supply holes 250a to 250c may have the same opening area and may be formed at the same opening pitch.

As described above, in the present embodiment, a gas is transferred through the nozzles 249a to 249c, which are disposed in the vertically-elongated annular space, i.e., a cylindrical space, defined by the inner wall of the reaction tube 203 and the end portions of the wafers 200 arranged within the reaction tube 203. The gas is initially injected into the reaction tube 203, near the wafers 200, through the gas supply holes 250a to 250c formed in the nozzles 249a to 249c. Accordingly, the gas supplied into the reaction tube 203 mainly flows in a direction parallel to surfaces of the wafers 200, i.e., in a horizontal direction. With this configuration, the gas can be uniformly supplied to the respective wafers 200. This makes it possible to improve the uniformity of a thickness of a thin film formed on each of the wafers 200. The gas flowing on the surfaces of the wafers 200, i.e., the reacted residual gas, flows toward an exhaust port, i.e., an exhaust pipe 231 which will be described later. The flow direction of the residual gas is not limited to a vertical direction but may be appropriately decided depending on the position of the exhaust port.

A precursor gas including a first element, for example, a halosilane precursor gas including Si as a first element and a halogen element, is supplied from the gas supply pipe 232a into the process chamber 201 via the WC 241a, the valve 243a and the nozzle 249a.

The halosilane precursor gas refers to a gaseous halosilane precursor, for example, a gas obtained by vaporizing a halosilane precursor which remains in a liquid state under a room temperature and an atmospheric pressure, or a halosilane precursor which remains in a gas state under a room temperature and an atmospheric pressure. The halosilane precursor refers to a silane precursor having a halogen group. Examples of the halogen group may include a chloro group, a fluoro group, a bromo group and an iodine group. That is to say, the halogen group includes a halogen element such as chlorine (Cl), fluorine (F), bromine (Br), iodine (I) or the like. It can be said that the halosilane precursor is one kind of halide. When the term "precursor" is used herein, it may refer to "a liquid precursor staying in a liquid state," "a precursor gas staying in a gaseous state," or both.

Figure 9A:
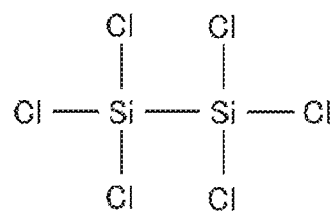
FIG. 9A is a view illustrating a chemical structural formula of HCDS.
Figure 9B:
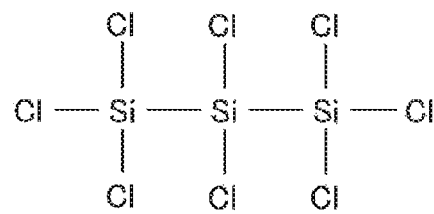
FIG. 9B is a view illustrating a chemical structural formula of OCTS.

As the halosilane precursor gas, it may be possible to use, e.g., a C-free precursor gas containing Si and Cl, namely an inorganic chlorosilane precursor gas. As the inorganic chlorosilane precursor gas, it may be possible to use, e.g., a hexachlorodisilane ($Si_2Cl_6$, abbreviation: HCDS) gas or an octachlorotrisilane ($Si_3Cl_8$, abbreviation: OCTS) gas. FIG. 9A illustrates a chemical structural formula of HCDS, and FIG. 9B illustrates a chemical structural formula of OCTS. These gases may be referred to as precursor gases which contain at least two Si atoms in one molecule and contain Cl and which have a Si—Si bond. These gases act as Si sources in a film forming process which will be described later.

Figure 10A:
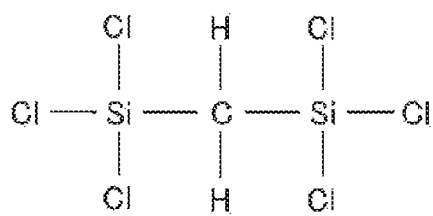
FIG. 10A is a view illustrating a chemical structural formula of BTCSM.
Figure 10B:
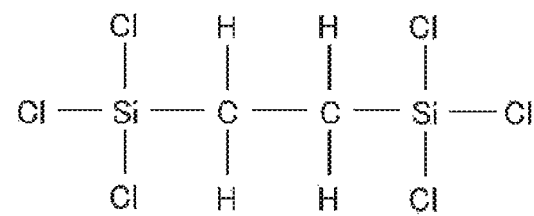
FIG. 10B is a view illustrating a chemical structural formula of BTCSE.

Furthermore, as the halosilane precursor gas, it may be possible to use, e.g., a precursor gas containing Si, Cl and an alkylene group and having a Si—C bond, namely an alkylene chlorosilane precursor gas which is an organic chlorosilane precursor gas. The alkylene group includes a methylene group, an ethylene group, a propylene group, a butylene group, and so forth. The alkylene chlorosilane precursor gas may be referred to as an alkylene halosilane precursor gas. As the alkylene chlorosilane precursor gas, it may be possible to use, e.g., a bis(trichlorosilyl)methane (($SiCl_3)_2CH_2$, abbreviation: BTCSM) gas and an ethylene bis(trichlorosilane) gas, namely a 1,2-bis(trichlorosilyl)ethane (($SiCl_3)_2C_2H_4$, abbreviation: BTCSE) gas. FIG. 10A illustrates a chemical structural formula of BTCSM, and FIG. 10B illustrates a chemical structural formula of BTCSE. These gases may be referred to as precursor gases which contain at least two Si atoms in one molecule and contain C and Cl and which have a Si—C bond. These gases act as Si sources and C sources in a film forming process which will be described later.

Figure 11A:
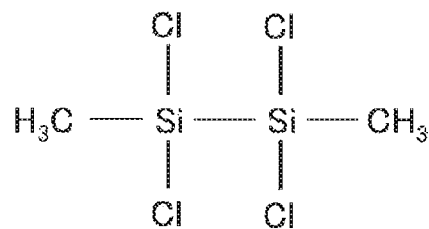
FIG. 11A is a view illustrating a chemical structural formula of TCDMDS.
Figure 11B:
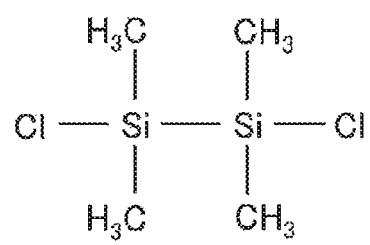
FIG. 11B is a view illustrating a chemical structural formula of DCTMDS.
Figure 11C:
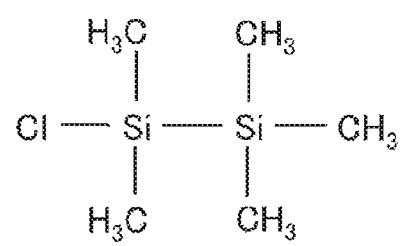
FIG. 11C is a view illustrating a chemical structural formula of MCPMDS.

Moreover, as the halosilane precursor gas, it may be possible to use, e.g., a precursor gas containing Si, Cl and an alkyl group and having a Si—C bond, namely an alkyl chlorosilane precursor gas which is an organic chlorosilane precursor gas. The alkyl group includes a methyl group, an ethyl group, a propyl group, a butyl group, and so forth. The alkyl chlorosilane precursor gas may be referred to as an alkyl halosilane precursor gas. As the alkyl chlorosilane precursor gas, it may be possible to use, e.g., a 1,1,2,2-tetrachloro-1,2-dimethyldisilane (($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas, a 1-monochloro-1,1,2,2,2-pentamethyldisilane (($CH_3)_5Si_2Cl$, abbreviation: MCPMDS) gas, or the like. FIG. 11A illustrates a chemical structural formula of TCDMDS, FIG. 11B illustrates a chemical structural formula of DCTMDS, and FIG. 11C illustrates a chemical structural formula of MCPMDS. These gases may be referred to as precursor gases which contain at least two Si atoms in one molecule and contain C and Cl and which have a Si—C bond. These gases further contain a Si—Si bond. These gases act as Si sources and C sources in a film forming process which will be described later.

In the case of using a liquid precursor, such as HCDS, BTCSM, TCDMDS or the like, which stays in a liquid state under a room temperature and an atmospheric pressure, the liquid precursor is vaporized by a vaporization system such as a vaporizer or a bubbler and is supplied as a precursor gas (an HCDS gas, a BTCSM gas, a TCDMDS gas, etc.).

As a reaction gas including a second element, an O-containing gas which contains oxygen (O) as a second element, is supplied into the process chamber 201 via the WC 241b, the valve 243b and the nozzle 249b. The O-containing gas acts as an oxidant (oxidizing gas), namely an O source, in a film forming process which will be described later. As the O-containing gas, it may be possible to use, e.g., water vapor ($H_2O$ gas). For example, pure water (or ultrapure water), such as RO (Reverse Osmosis) water from which impurities are removed using a reverse osmosis membrane, deionized water from which impurities are removed by performing a deionization treatment, distilled water from which impurities are removed through distillation using a distillation device, or the like, is vaporized by a vaporization system such as a vaporizer, a bubbler or a boiler and is supplied as a reaction gas ($H_2O$ gas).

A catalyst gas (a first catalyst gas or a second catalyst gas) which promotes a film forming reaction generated by the precursor gas or the reaction gas described above is supplied from the gas supply pipe 232c into the process chamber 201 via the MFC 241c, the valve 243c and the nozzle 249c. As the catalyst gas, it may be possible to use, e.g., an amine-based gas containing C, N and H.

The amine-based gas is a gas which includes amine obtained by substituting at least one of H atoms of ammonia ($NH_3$) with a hydrocarbon group such as an alkyl group or the like. As illustrated in FIGS. 12A to 12F, amine which includes N having a lone pair of electrons and which has an acid dissociation constant (hereinafter also referred to as pKa) of, e.g., about 5 to 11 may be suitably used as a catalyst. The acid dissociation constant (pKa) is one index quantitatively indicating the strength of an acid. The acid dissociation constant (pKa) refers to a negative common logarithm which represents an equilibrium constant Ka in a dissociation reaction in which H ions are released from an acid. As the amine-based gas, it may be possible to use a cyclic amine-based gas in which hydrocarbon groups have a cyclic shape, or a chain amine-based gas in which hydrocarbon groups have a chain shape.

As the cyclic amine-based gas, it may be possible to use, e.g., a pyridine ($C_5H_5N$, pKa=5.67) gas, an aminopyridine ($C_5H_6N_2$, pKa=6.89) gas, a picoline ($C_6H_7N$, pKa=6.07) gas, a lutidine ($C_7H_9N$, pKa=6.96) gas, a piperazine ($C_4H_{10}N_2$, pKa=9.80) gas, or a piperidine ($C_5H_{11}N$, pKa=11.12) gas, as illustrated in FIG. 12A. It can be said that the cyclic amine-based gas is a heterocyclic compound whose cyclic structure is formed by plural kinds of elements such as C and N, namely a nitrogen-containing heterocyclic compound.

As the chain amine-based gas, it may be possible to use, e.g., a triethylamine (($C_2H_5)_3N$, abbreviation: TEA, pKa=10.7) gas, a diethylamine (($C_2H_5)_2NH$, abbreviation: DEA, pKa=10.9) gas, a monoethylamine (($C_2H_5)NH_2$, abbreviation: MEA, pKa=10.6) gas, a trimethylamine (($CH_3)_3N$, abbreviation: TMA, pKa=9.8) gas, or a monomethylamine (($CH_3)NH_2$, abbreviation: MMA, pKa=10.6) gas, as illustrated in FIGS. 12B to 12F.

The amine-based gas acting as a catalyst may be referred to as an amine-based catalyst or an amine-based catalyst gas. As the catalyst gas, in addition to the amine-based gas mentioned above, it may be possible to use a non-amine-based gas, e.g., an ammonia ($NH_3$, pKa=9.2).

It is sometimes the case that the molecular structure of the catalyst illustrated herein is partially decomposed in a film forming process which will be described later. Such a substance which partially undergoes a change before and after a chemical reaction is not a "catalyst" in a strict meaning. However, in the subject specification, a substance which is partially decomposed but not mostly decomposed in the course of a chemical reaction and which changes a reaction speed and substantially acts as a catalyst will be referred to as a "catalyst".

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c, and the nozzles 249a to 249c.

In the case of supplying the precursor gas from the gas supply pipe 232a, a precursor gas supply system is mainly configured by the gas supply pipe 232a, the WC 241a, and the valve 243a. The precursor gas supply system may also include the nozzle 249a. The precursor gas supply system may be referred to as a precursor supply system. In the case of supplying a halosilane precursor gas from the gas supply pipe 232a, the precursor gas supply system may be referred to as a halosilane precursor gas supply system or a halosilane precursor supply system.

In the case of supplying the reaction gas from the gas supply pipe 232b, a reaction gas supply system is mainly configured by the gas supply pipe 232b, the MFC 241b, and the valve 243b. The reaction gas supply system may also include the nozzle 249b. In the case of supplying an O-containing gas from the gas supply pipe 232b, the reaction gas supply system may be referred to as an O-containing gas supply system, an oxidant supply system or an oxidizing gas supply system.

In the case of supplying the catalyst gas (the first catalyst gas or the second catalyst gas) from the gas supply pipe 232c, a catalyst gas supply system is mainly configured by the gas supply pipe 232c, the MFC 241c, and the valve 243c. The catalyst gas supply system may also include the nozzle 249c. The catalyst gas supply system may be referred to as a catalyst supply system. In the case of supplying an amine-based gas from the gas supply pipe 232c, the catalyst gas supply system may be referred to as an amine-based catalyst gas supply system, an amine-based gas supply system or an amine supply system.

In addition, an inert gas supply system is mainly configured by the gas supply pipes 232d to 232f, the MFCs 241d to 241f and the valves 243d to 243f The inert gas supply system may be referred to as a purge gas supply system, a dilution gas supply system or a carrier gas supply system.

An exhaust pipe 231 for exhausting an internal atmosphere of the process chamber 201 is installed in the reaction tube 203. A vacuum pump 246 as a vacuum exhaust device is connected to the exhaust pipe 231 via a pressure sensor 245, which is a pressure detector (pressure detecting part) for detecting an internal pressure of the process chamber 201, and an Auto Pressure Controller (APC) valve 244, which is a pressure regulator (pressure regulating part). The APC valve 244 is configured to perform or stop vacuum exhaust in the process chamber 201 by opening or closing the valve while actuating the vacuum pump 246 and is also configured to regulate the internal pressure of the process chamber 201 by adjusting an opening degree of the valve pursuant to pressure information detected by the pressure sensor 245 while actuating the vacuum pump 246. An exhaust system is mainly configured by the exhaust pipe 231, the APC valve 244 and the pressure sensor 245. The exhaust system may include the vacuum pump 246. The exhaust pipe 231 may not be installed in the reaction tube 203. Similar to the nozzles 249a to 249c, the exhaust pipe 231 may be installed in the manifold 209.

A seal cap 219, which serves as a furnace opening cover configured to hermetically seal a lower end opening of the manifold 209, is installed under the manifold 209. The seal cap 219 is configured to make contact with the lower end of the manifold 209 at a lower side in the vertical direction. The seal cap 219 is made of metal such as, e.g., stainless steel or the like, and is formed into a disc shape. An O-ring 220b, which is a seal member making contact with the lower end portion of the manifold 209, is installed on an upper surface of the seal cap 219. A rotary mechanism 267 configured to rotate a boat 217 which will be described later is installed at a side of the seal cap 219 opposite to the process chamber 201. A rotary shaft 255 of the rotary mechanism 267, which extends through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 115 is configured to load and unload the boat 217 into and out of the process chamber 201 by moving the seal cap 219 up and down. As such, the boat elevator 115 is configured as a transfer device (transfer mechanism) which transfers the boat 217, ultimately, the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction, namely arranged in a spaced-apart relationship, with the centers of the wafers 200 concentrically aligned with one another. The boat 217 is made of a heat resistant material such as quartz or SiC. Heat insulating plates 218 made of a heat resistant material such as quartz or SiC are installed in a lower portion of the boat 217 in a horizontal posture and in multiple stages. With this configuration, it is hard for the heat generated in the heater 207 to be transferred to the seal cap 219. However, the present embodiment is not limited to the above-described configuration. For example, instead of installing the heat insulating plates 218 in the lower portion of the boat 217, a heat insulating tube as a tubular member made of a heat resistant material such as quartz or SiC may be installed in the lower portion of the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired or specified temperature distribution. Similar to the nozzles 249a to 249c, the temperature sensor 263 is formed in an L-shape. The temperature sensor 263 is installed along the inner wall of the reaction tube 203.

Figure 3:
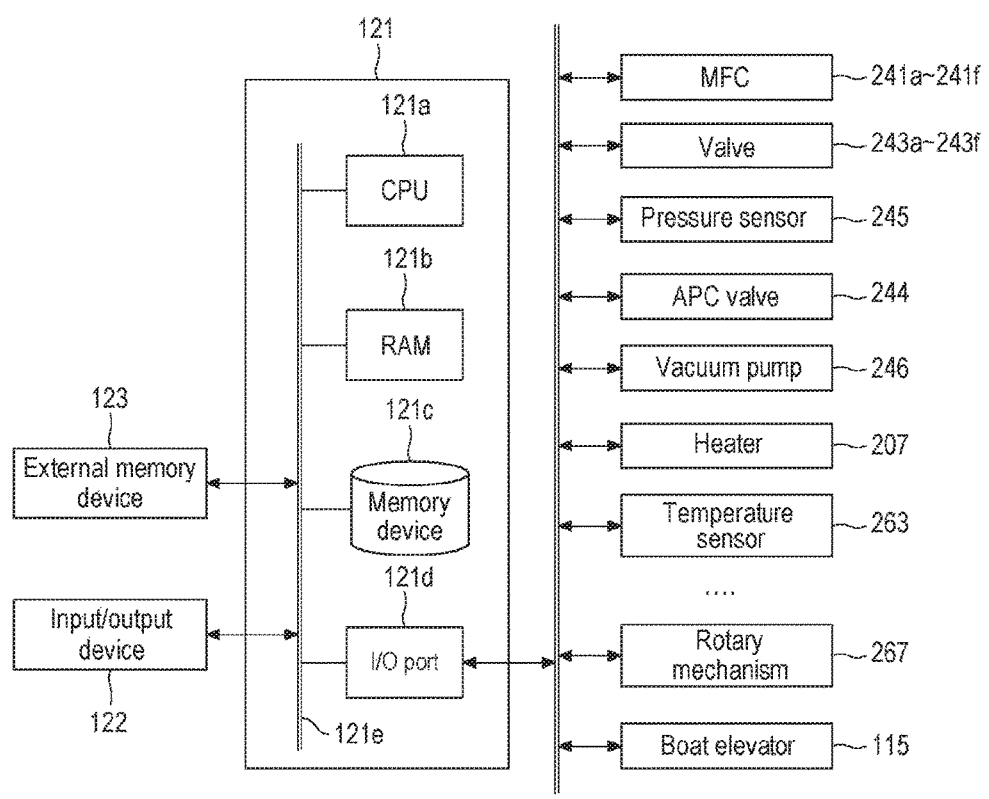
FIG. 3 is a schematic configuration view of a controller of the substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disc drive (HDD), or the like. A control program for controlling operations of a substrate processing apparatus or a process recipe, in which a sequence or condition for processing a substrate to be described later is written, is readably stored in the memory device 121c. The process recipe functions as a program for causing the controller 121 to execute each sequence in the substrate processing procedure, which will be described later, to obtain a predetermined result. Hereinafter, such a process recipe or control program will be generally referred to as a "program." Furthermore, the process recipe will be simply referred to as a "recipe". When the term "program" is used herein, it may indicate a case of including only a process recipe, a case of including only a control program, or a case of including both a process recipe and a control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the heater 207, the temperature sensor 263, the rotary mechanism 267, the boat elevator 115, and the like.

The CPU 121a is configured to read and execute the control program from the memory device 121c. The CPU 121a also reads the process recipe from the memory device 121c according to an input of an operation command from the input/output device 122. The CPU 121a is configured to control the flow rate adjusting operation of various kinds of gases performed by the MFCs 241a to 241f, the opening/closing operation of the valves 243a to 243f, the opening/closing operation of the APC valve 244, the pressure regulating operation performed by the APC valve 244 based on the pressure sensor 245, the start/stop operation of the vacuum pump 246, the temperature adjusting operation performed by the heater 207 based on the temperature sensor 263, the operation of rotating the boat 217 with the rotary mechanism 267 and adjusting the rotation speed of the boat 217, the operation of moving the boat 217 up and down with the boat elevator 115, and the like, according to contents of the read process recipe.

The controller 121 may be configured by installing into a computer the aforementioned program stored in an external memory device 123 (for example, a magnetic tape, a magnetic disc such as a flexible disc or a hard disc, an optical disc such as a CD or a DVD, a magneto-optical disc such as an MO, a semiconductor memory such as a USB memory or a memory card). The memory device 121c or the external memory device 123 is configured as a non-transitory computer-readable recording medium. Hereinafter, the memory device 121c or the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. In addition, the program may be provided to the computer using a communication means such as the Internet or a dedicated line without having to use the external memory device 123.

(2) Substrate Processing Process

An example of a sequence for forming a thin film on a substrate, which is one of the processes for manufacturing a semiconductor device by using the aforementioned substrate processing apparatus, will now be described with reference to FIG. 4A. In the following descriptions, the operations of the respective parts constituting the substrate processing apparatus are controlled by the controller 121.

In a film forming sequence according to the present embodiment, a silicon oxycarbide film (SiOC film) as a Si-, O- and C-containing film is formed on a wafer 200 by performing, a predetermined number of times (n times), a cycle that non-simultaneously performs:

step 1 of forming a first layer by supplying a TCDMDS gas as a precursor gas including a Si—C bond and a pyridine gas as a first catalyst gas to the wafer 200 as a substrate in a process chamber 201;

step 2 of exhausting the TCDMDS gas and the pyridine gas in the process chamber 201 through an exhaust system;

step 3 of forming a second layer by supplying an H$_2$O gas as an O-containing reaction gas and a pyridine gas as a second catalyst gas to the wafer 200 in the process chamber 201 and modifying the first layer; and step 4 of exhausting the H$_2$O gas and the pyridine gas in the process chamber 201 through the exhaust system. In the present embodiment, there is illustrated an example in which the first catalyst gas has the same molecular structure as the second catalyst gas.

At least in a specific cycle when performing the cycle a predetermined number of times, a process of supplying and confining the respective gases in the process chamber 201 while closing the exhaust system (hereinafter often simply referred to as "confining") is implemented in at least one of step 1 of forming the first layer and step 3 of forming the second layer.

Figure 4A:
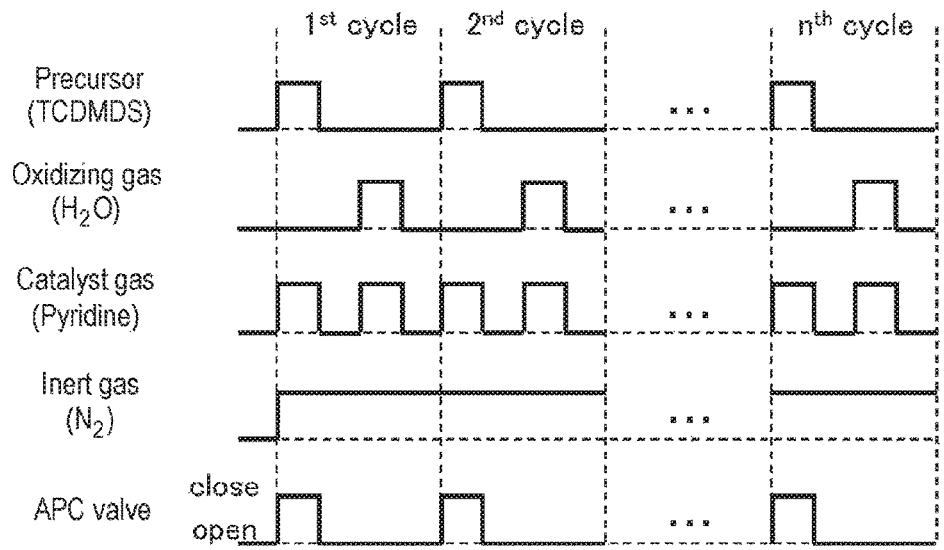
FIG. 4A is a view illustrating a film forming sequence according to one embodiment of the present disclosure.

In the film forming sequence illustrated in FIG. 4A, the confining is implemented only at step 1 of supplying the TCDMDS gas and the pyridine gas and is not implemented at step 3 of supplying the H$_2$O gas and the pyridine gas. In the film forming sequence illustrated in FIG. 4A, it is assumed that a C-rich SiOC film having a relatively high C concentration, for example, an SiOC film having a C concentration higher than an O concentration, is formed for the reasons which will be described later.

As used herein, the term "C-rich SiOC film" refers to an SiOC film which is higher in C concentration than an SiOC film having a stoichiometric composition. That is to say, the term "C-rich SiOC film" refers to an SiOC film which is larger in percentage of C to Si and O than a SiOC film having a stoichiometric composition.

As used herein, the term "O-rich SiOC film" refers to an SiOC film which is higher in O concentration than an SiOC film having a stoichiometric composition. That is to say, the term "O-rich SiOC film" refers to an SiOC film which is larger in percentage of O to Si and C than an SiOC film having a stoichiometric composition.

In the subject specification, for the sake of convenience, the film forming sequence illustrated in FIG. 4A may sometimes be indicated as follows. The same indication will be used in describing modifications and other embodiments later.

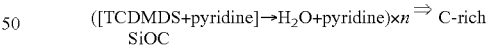

$([TCDMDS+pyridine] \rightarrow H_2O+pyridine) \times n \Rightarrow$ C-rich SiOC As used herein, the term "wafer" may refer to "a wafer itself" or "a laminated body (an assembly) of a wafer and a predetermined layer or film formed on a surface of the wafer" (namely, a wafer including a predetermined layer or film formed on its surface may be referred to as a wafer). In addition, as used herein, the phrase "a surface of a wafer" may refer to "a surface (exposed surface) of a wafer itself" or "a surface of a predetermined layer or film formed on a wafer, namely an uppermost surface of a wafer as a laminated body".

As used herein, the expression "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" as used herein may be synonymous with the term "wafer." In this case, the term "wafer" and "substrate" may be used interchangeably in the above descriptions.

(Wafer Charging and Boat Loading)

A plurality of wafers 200 is charged to the boat 217 (wafer charging). Thereafter, as illustrated in FIG. 1, the boat 217 charged with the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment)

The interior of the process chamber 201, namely the space in which the wafers 200 exist, is vacuum-exhausted (de-pressurization-exhausted) by the vacuum pump 246 so as to reach a desired or specified pressure (desired or specified vacuum level). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired or specified temperature. In this operation, the state of supplying electric power to the heater 207 is feedback-controlled based on the temperature information detected by the temperature sensor 263 such that the interior of the process chamber 201 reaches a desired or specified temperature distribution. The heating of the interior of the process chamber 201 by the heater 207 may be continuously performed at least until the processing of the wafers 200 is completed. The boat 217 and the wafers 200 begin to be rotated by the rotary mechanism 267. The rotation of the boat 217 and the wafers 200 by the rotary mechanism 267 may be continuously performed at least until the processing of the wafers 200 is completed.

(Film Forming Process)

[Step 1]

At this step, a TCDMDS gas and a pyridine gas are supplied to the wafers 200 in the process chamber 201. At this time, the TCDMDS gas and the pyridine gas are supplied into the process chamber 201 while closing the exhaust system. In this way, the confining of the TCDMDS gas and the pyridine gas in the process chamber 201 is implemented.

Specifically, the APC valve 244 is fully closed and the evacuation of the interior of the process chamber 201 by the exhaust system is stopped. Furthermore, the valves 243a and 243c are opened. The TCDMDS gas is allowed to flow through the gas supply pipe 232a and the pyridine gas is allowed to flow through the gas supply pipe 232c. The TCDMDS gas and the pyridine gas are flow rate-controlled by the MFCs 241a and 241c and are supplied into the process chamber 201 via the nozzles 249a and 249c. The TCDMDS gas and the pyridine gas are mixed with each other after they are supplied into the process chamber 201 (post-mixing). At the same time, the valves 243d and 243f are opened and an $N_2$ gas is allowed to flow through the gas supply pipes 232d and 232f. The $N_2$ gas flowing through the gas supply pipes 232d and 232f is flow rate-adjusted by the MFCs 241d and 241f and is supplied into the process chamber 201 together with the TCDMDS gas and the pyridine gas. In order to prevent infiltration of the TCDMDS gas and the pyridine gas into the nozzle 249b, the valve 243e is opened and the $N_2$ gas is allowed to flow through the gas supply pipe 232e. The $N_2$ gas is supplied into the process chamber 201 via the gas supply pipe 232b and the nozzle 249b.

At this time, a supply flow rate of the TCDMDS gas controlled by the MFC 241a is set to fall within a range of, e.g., 1 to 2,000 sccm, specifically, 10 to 1,000 sccm. A supply flow rate of the pyridine gas controlled by the MFC 241c is set to fall within a range of, e.g., 1 to 2,000 sccm, specifically, 10 to 1,000 sccm. Supply flow rates of the $N_2$ gas controlled by the MFCs 241d to 241f are respectively set to fall within a range of, e.g., 100 to 10,000 sccm.

By supplying the TCDMDS gas and the pyridine gas into the process chamber 201 while closing the exhaust system, the internal pressure of the process chamber 201 begins to increase. By continuously supplying the gases, the finally-reached internal pressure (ultimate internal pressure) of the process chamber 201 becomes a pressure which falls within a range of, e.g., 400 to 5,000 Pa, specifically 500 to 4,000 Pa. By setting the internal pressure of the process chamber 201 at such a high pressure, it becomes possible to thermally and efficiently activate (excite) the TCDMDS gas and the pyridine gas in a non-plasma manner. If the TCDMDS gas and the pyridine gas are supplied by thermally activating them, it is possible to generate a relatively soft reaction and to relatively softly perform a film forming reaction which will be described later.

The time during which the TCDMDS gas and the pyridine gas are supplied to the wafers 200 while closing the exhaust system, namely the gas supply time (irradiation time), is set to fall within a range of, e.g., 1 to 100 seconds, specifically 5 to 60 seconds.

The temperature of the heater 207 is set such that the temperature of the wafers 200 falls within a range of, e.g., a room temperature (25 degrees C.) or more and 150 degrees C. or less, specifically a room temperature or more and 100 degrees C. or less, more specifically 50 degrees C. or more and 100 degrees C. or less. In the case where the pyridine gas is not supplied when supplying the TCDMDS gas, if the temperature of the wafers 200 is lower than 250 degrees C., TCDMDS is hardly chemisorbed onto the wafers 200. Thus, a practical deposition rate may not be obtained. By supplying the pyridine gas together with the TCDMDS gas, even if the temperature of the wafers 200 is lower than 250 degrees C., it is possible to eliminate the above problem. By setting the temperature of the wafers 200 at 150 degrees C. or less, ultimately 100 degrees C. or less, under the existence of the pyridine gas, it is possible to reduce the quantity of heat applied to the wafers 200 and to reliably control the thermal hysteresis suffered by the wafers 200. Under the existence of the pyridine gas, if the temperature of the wafers 200 is equal to or higher than a room temperature, it is possible to have TCDMDS chemisorbed onto the wafers 200 and to perform a film forming process. For that reason, the temperature of the wafers 200 may preferably be set to fall within a range of a room temperature or more and 150 degrees C. or less, specifically a room temperature or more and 100 degrees C. or less, more specifically 50 degrees C. or more and 100 degrees C. or less.

By supplying the TCDMDS gas to the wafers 200 under the aforementioned conditions, a first layer, for example, a Si-containing layer including C and Cl and having a thickness of from less than one atomic layer to several atomic layers, is formed on the wafer 200 (on an underlying film of the surface of the wafer 200). The Si-containing layer including C and Cl becomes a layer including a Si—C bond. The Si-containing layer including C and Cl may be a Si layer including C and Cl, an adsorption layer of TCDMDS, or a layer including the Si layer and the adsorption layer. In the subject specification, for the sake of convenience, the Si-containing layer including C and Cl may be simply referred to as a Si-containing layer including C.

The Si layer including C and Cl is a generic name that encompasses a continuous or discontinuous layer including C and Cl, which is composed of Si, and a Si thin film including C and Cl, which is formed of the layers overlapping with one another. The continuous layer including C and Cl, which is composed of Si, is sometimes referred to as a Si thin film including C and Cl. The Si which constitutes the Si layer including C and Cl includes not only Si whose bond to C or Cl is not completely broken, but also Si whose bond to C or Cl is completely broken.

The adsorption layer of TCDMDS includes not only a continuous adsorption layer composed of TCDMDS molecules but also a discontinuous adsorption layer. That is to say, the adsorption layer of TCDMDS includes an adsorption layer having a thickness of one molecular layer or less than one molecular layer, which is composed of TCDMDS molecules. The TCDMDS molecules that constitute the adsorption layer of TCDMDS include a molecule having a chemical structural formula illustrated in FIG. 11A, a molecule in which Si—C bonds are partially broken, and a molecule in which Si—Cl bonds are partially broken. That is to say, the adsorption layer of TCDMDS may include a physisorption layer of TCDMDS, a chemisorption layer of TCDMDS, or both.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The Si-containing layer including C and Cl may include both a Si layer including C and Cl and an adsorption layer of TCDMDS. As described above, expressions such as "one atomic layer", "several atomic layers" and the like will be used with respect to the Si-containing layer including C and Cl.

If the thickness of the first layer formed on the wafer 200 exceeds several atomic layers, an oxidizing action at step 3, which will be described later, does not affect the entire first layer. In addition, a minimum value of the thickness of the first layer capable of being formed on the wafer 200 is less than one atomic layer. Accordingly, the thickness of the first layer may be set to fall within a range of from less than one atomic layer to several atomic layers. By setting the thickness of the first layer to become one atomic layer or less, namely one atomic layer or less than one atomic layer, it is possible to relatively increase the action of an oxidizing reaction at step 3 which will be described later and to shorten the time required in an oxidizing reaction at step 3. It is also possible to shorten the time required in the formation of the first layer at step 1. Consequently, it is possible to shorten the processing time per one cycle. This makes it possible to shorten the total processing time. That is to say, it is possible to increase the deposition rate. Furthermore, by setting the thickness of the first layer to become one atomic layer or less, it is possible to enhance the controllability of the film thickness uniformity.

Under a condition in which the TCDMDS gas is autolyzed (or pyrolyzed), i.e., a condition in which a pyrolysis reaction of TCDMDS is generated, Si is deposited on the wafer 200 to form a Si layer including C and Cl. Under a condition in which the TCDMDS gas is not autolyzed (or pyrolyzed), i.e., a condition in which a pyrolysis reaction of TCDMDS is not generated, TCDMDS is adsorbed onto the wafer 200 to form an adsorption layer of TCDMDS. Under both conditions, at least some of Si—C bonds of the TCDMDS gas are held (maintained) without being broken and are directly introduced into the Si-containing layer (the Si layer including C and Cl or the adsorption layer of TCDMDS). From the viewpoint of increasing the deposition rate, it may be more advantageous to form the Si layer including C and Cl on the wafer 200 than to form the adsorption layer of TCDMDS on the wafer 200. In the present embodiment, the temperature of the wafer 200 is set at a low temperature of, e.g., 150 degrees C. or less. Therefore, the adsorption layer of TCDMDS is more easily formed on the wafer 200 than the Si layer including C and Cl. In the case where the pyridine gas is not supplied together with the TCDMDS gas, the adsorption layer of TCDMDS tends to be configured by a physisorption layer of TCDMDS rather than a chemisorption layer of TCDMDS.

The pyridine gas acts as a catalyst gas (first catalyst gas) which weakens a bonding force of an O—H bond existing on the surface of the wafer 200, accelerates decomposition of the TCDMDS gas and promotes formation of the first layer by the chemisorption of TCDMDS molecules. For example, the pyridine gas affects an O—H bond existing on the surface of the wafer 200 and acts to weaken a bonding force thereof. The H having a weakened bonding force reacts with the Cl of the TCDMDS gas, whereby a gaseous substance including Cl and H is generated. The H is desorbed from the surface of the wafer 200 and the Cl is desorbed from the TCDMDS molecule. The TCDMDS molecule (halide) that has lost Cl is chemisorbed onto the surface of the wafer 200. Thus, a chemisorption layer of TCDMDS as the first layer is formed on the wafer 200.

The reason for the bonding force of the O—H bond existing on the surface of the wafer 200 being weakened by the catalyst action of the pyridine gas is that the N existing in a pyridine molecule and having a lone pair of electrons acts to attract the H. A compound having a large pKa is strong in H-attracting force. By using a compound having a pKa of 5 or more as the first catalyst gas, it is possible to accelerate decomposition of TCDMDS and to promote formation of the first layer by chemisorption. However, if a compound having an excessively-large pKa is used as the first catalyst gas, the Cl extracted from a TCDMDS molecule may react with the first catalyst gas, whereby a salt (particle source) such as ammonium chloride ($NH_4Cl$) or the like may be generated. For that reason, a compound having a pKa of, e.g., 11 or less, specifically 7 or less, may preferably be used as the first catalyst gas. The pyridine gas has a relatively large pKa of 5.67 which is not greater than 7. It is therefore possible to suitably use the pyridine gas as the first catalyst gas.

As the precursor gas, in addition to the TCDMDS gas, it may be possible to use, e.g., a silane precursor gas having a Si—C bond such as a DCTMDS gas, an MCPMDS gas, a BTCSM gas, a BTCSE gas or the like.

As the first catalyst gas, in addition to the pyridine gas, it may be possible to use, e.g., a cyclic amine-based gas such as an aminopyridine gas, a picoline gas, a lutidine gas, a piperazine gas, a piperidine gas or the like, a chain amine-based gas such as a TEA gas, a DEA gas, an MEA gas, a TMA gas, an MMA gas or the like, or a non-amine-based gas such as an $NH_3$ gas or the like.

As the inert gas, in addition to the $N_2$ gas, it may be possible to use, e.g., a rare gas such as an Ar gas, a He gas, a Ne gas, a Xe gas or the like.

[Step 2]

After the first layer is formed, the valves 243a and 243c are closed to stop the supply of the TCDMDS gas and the pyridine gas into the process chamber 201. Then, the APC valve 244 is opened and the interior of the process chamber 201 is evacuated by the vacuum pump 246. The TCDMDS gas, the pyridine gas and the reaction byproducts remaining within the process chamber 201, which have not reacted or which have contributed to the formation of the first layer, are discharged from the interior of the process chamber 201. At this time, the valves 243d to 243f are kept opened to continuously supply the $N_2$ gas into the process chamber 201. The $N_2$ gas acts as a purge gas. This makes it possible to effectively discharge the TCDMDS gas and the pyridine gas remaining within the process chamber 201, which have not reacted or which have contributed to the formation of the first layer, from the interior of the process chamber 201.

In this case, the gases remaining within the process chamber 201 may not be completely discharged and the interior of the process chamber 201 may not be completely purged. If the amount of the gases remaining within the process chamber 201 is small, an adverse effect may not be generated at step 3 which will be subsequently performed. The flow rate of the $N_2$ gas supplied into the process chamber 201 need not be made large. For example, an amount of the $N_2$ gas to be supplied into the process chamber 201 may be set substantially equal to the volume of the reaction tube 203 (the process chamber 201). This makes it possible to perform a purge operation without causing an adverse effect at step 3. As such, by not completely purging the interior of the process chamber 201, it is possible to shorten the purge time and to improve the throughput. It is also possible to suppress the consumption of the $N_2$ gas to a necessary minimum level.

As the inert gas, in addition to the $N_2$ gas, it may be possible to use, e.g., various kinds of rare gases described above.

[Step 3]

After step 2 is completed, an $H_2O$ gas and a pyridine gas are supplied to the wafers 200 in the process chamber 201. At this time, the $H_2O$ gas and the pyridine gas are supplied into the process chamber 201 while keeping the exhaust system opened. The confining of the $H_2O$ gas and the pyridine gas in the process chamber 201 is not implemented.

Specifically, the APC valve 244 is opened and the evacuation of the interior of the process chamber 201 is performed by the exhaust system. The opening/closing control of the valves 243b, 243c and 243d to 243f is executed in the same procedure as the opening/closing control of the valves 243a, 243c and 243d to 243f at step 1. The $H_2O$ gas and the pyridine gas are flow rate-controlled by the MFCs 241b and 241c and are supplied into the process chamber 201 via the nozzles 249b and 249c. The $H_2O$ gas and the pyridine gas are mixed with each other after they are supplied into the process chamber 201 (post-mixing). In addition, an $N_2$ gas which prevents infiltration of the $H_2O$ gas into the nozzle 249a is supplied into the process chamber 201 via the gas supply pipe 232a and the nozzle 249a.

In this case, the supply flow rate of the $H_2O$ gas controlled by the MFC 241b is set to fall within a range of, e.g., 10 to 10,000 sccm, specifically 100 to 1,000 sccm. The supply flow rate of the pyridine gas controlled by the MFC 241c is set to fall within a range of, e.g., 1 to 2,000 sccm, specifically 10 to 1,000 sccm. Furthermore, the amount of the pyridine gas supplied at step 3 and the amount of the pyridine gas supplied at step 1 may be controlled independently of each other. For example, the supply amounts of the pyridine gas at steps 1 and 3 may be equal to each other or may differ from each other.

The internal pressure of the process chamber 201 is set to fall within a range of, e.g., 50 to 5,000 Pa, specifically 100 to 4,000 Pa. By setting the internal pressure of the process chamber 201 to fall within this pressure range, it becomes possible to thermally activate the $H_2O$ gas and the pyridine gas in a non-plasma manner. If the $H_2O$ gas and the pyridine gas are supplied by thermally activating them, it is possible to generate a relatively soft reaction and to relatively softly perform the oxidization which will be described later.

The time during which the $H_2O$ gas and the pyridine gas are supplied to the wafers 200, namely, the gas supply time (irradiation time), is set to fall within a range of, e.g., 1 to 100 seconds, specifically 5 to 60 seconds.

Other processing conditions may be similar to, e.g., the processing conditions of step 1.

By supplying the $H_2O$ gas to the wafers 200 under the aforementioned conditions, at least a portion of the first layer (the Si-containing layer including C and Cl) formed on the wafer 200 at step 1 is oxidized (modified). As the first layer is modified, a second layer including Si, O and C, namely a silicon oxycarbide layer (SiOC layer), is formed. When forming the second layer, at least some of Si—C bonds are maintained without being broken and are directly introduced into the second layer (survived). When forming the second layer, the impurity such as Cl or the like, which is contained in the first layer, forms a gaseous substance including at least Cl in the course of a modifying reaction generated by the $H_2O$ gas. The gaseous substance is discharged from the interior of the process chamber 201. That is to say, the impurity such as Cl or the like existing in the first layer is extracted or desorbed from the first layer and is eventually separated from the first layer. Thus, the second layer becomes a layer which is smaller in the amount of the impurity such as Cl or the like than the first layer.

The pyridine gas acts as a catalyst gas (second catalyst gas) which weakens a bonding force of an O—H bond of the $H_2O$ gas, accelerates decomposition of the $H_2O$ gas and promotes formation of the second layer by the reaction of the $H_2O$ gas and the first layer. For example, the pyridine gas affects an O—H bond of the $H_2O$ gas and acts to weaken a bonding force thereof. The H having a weakened bonding force reacts with the Cl of the first layer formed on the wafer 200, whereby a gaseous substance including Cl and H is generated. The H is desorbed from the $H_2O$ molecule and the Cl is desorbed from the first layer. The O of the $H_2O$ gas that has lost H is bonded to the Si of the first layer from which Cl is desorbed while leaving at least a part of C. Thus, an oxidized first layer, namely a second layer, is formed on the wafer 200.

The reason for the bonding force of the O—H bond of the $H_2O$ gas being weakened by the catalyst action of the pyridine gas is that the N existing in a pyridine molecule and having a lone pair of electrons acts to attract the H. As described above, a compound having a large pKa is strong in H-attracting force. By using a compound having a pKa of 5 or more as the second catalyst gas, it is possible to appropriately weaken the bonding force of the O—H bond of the $H_2O$ gas and to promote the aforementioned oxidizing reaction. However, if a compound having an excessively-large pKa is used as the second catalyst gas, the Cl extracted from the first layer may react with the second catalyst gas, whereby a salt such as $NH_4Cl$ or the like may be generated. For that reason, a compound having a pKa of, e.g., 11 or less, specifically 7 or less, may preferably be used as the second catalyst gas. The pyridine gas has a relatively large pKa of 5.67 which is not greater than 7. It is therefore possible to suitably use the pyridine gas as the second catalyst gas. On this point, the second catalyst gas is similar to the first catalyst gas.

As the reaction gas, in addition to the $H_2O$ gas, it may be possible to use, e.g., an O-containing gas including an O—H bond, such as a hydrogen peroxide ($H_2O_2$) gas or the like. Moreover, as the reaction gas, it may be possible to use an O-containing gas not including an O—H bond, for example, an oxygen ($O_2$) gas, an ozone ($O_3$) gas, a hydrogen ($H_2$)+$O_2$ gas or an $H_2$+$O_3$ gas.

As the second catalyst gas, in addition to the pyridine gas, it may be possible to use, e.g., the amine-based gas or the non-amine-based gas described above. That is to say, as the second catalyst gas, it may be possible to use a gas having the same molecular structure (chemical structure) as the aforementioned first catalyst gas, namely a gas which is identical in material with the aforementioned first catalyst gas. In addition, as the second catalyst gas, it may be possible to use a gas differing in molecular structure from the aforementioned first catalyst gas, namely a gas differing in material from the aforementioned first catalyst gas.

As the inert gas, in addition to the $N_2$ gas, it may be possible to use, e.g., various kinds of rare gases described above.

[Step 4]

After the second layer is formed, the valves 243b and 243c are closed and the supply of the $H_2O$ gas and the pyridine gas into the process chamber 201 is stopped. Then, by virtue of the same processing procedure as that of step 2, the $H_2O$ gas, the pyridine gas and the reaction byproducts remaining within the process chamber 201, which have not reacted or which have contributed to the formation of the second layer, are discharged from the interior of the process chamber 201. At this time, similar to step 2, the gases remaining within the process chamber 201 may not be completely discharged. As the inert gas, in addition to the $N_2$ gas, it may be possible to use, e.g., various kinds of rare gases described above.

(Performing a Predetermined Number of Times)

The cycle which non-simultaneously performs above-described steps 1 to 4 is implemented once or more (a predetermined number of times) to thereby form an SiOC film having a predetermined composition and a predetermined thickness on the wafer 200. The above cycle may be repeated multiple times. That is to say, the thickness of the second layer (SiOC layer) formed per one cycle may be set to become smaller than a desired or specified film thickness. The above cycle may be repeated multiple times until the film thickness of the SiOC film formed by laminating the second layers becomes equal to the desired or specified film thickness.

(Purge and Return to Atmospheric Pressure)

The valves 243d to 243f are opened. The $N_2$ gas is supplied into the process chamber 201 from each of the gas supply pipes 232d to 232f and is exhausted from the exhaust pipe 231. The $N_2$ gas serves as a purge gas. Thus, the interior of the process chamber 201 is purged, and the gases or the reaction byproducts remaining within the process chamber 201 are removed from the interior of the process chamber 201 (purge). Thereafter, the internal atmosphere of the process chamber 201 is substituted with an inert gas (inert gas substitution), and the internal pressure of the process chamber 201 is returned to an atmospheric pressure (return to atmospheric pressure).

(Boat Unloading and Wafer Discharge)

The seal cap 219 is moved down by the boat elevator 115 to open the lower end of the manifold 209. The processed wafers 200 supported by the boat 217 are unloaded from the lower end of the manifold 209 to the outside of the reaction tube 203 (boat unloading). Thereafter, the processed wafers 200 are discharged from the boat 217 (wafer discharge).

(3) Effects According to the Present Embodiment

According to the present embodiment, one or more effects may be achieved as follows.

(a) At step 1, the TCDMDS gas and the pyridine gas are supplied into the process chamber 201 while closing the exhaust system and are confined in the process chamber 201 (confining is performed). Therefore, as compared with a case where the TCDMDS gas and the pyridine gas are supplied into the process chamber 201 while opening the exhaust system (confining is not performed), it is possible to increase the formation rate of the first layer.

By performing the confining, it is possible to prevent the TCDMDS gas and the pyridine gas supplied into the process chamber 201 from being discharged from the interior of the process chamber 201 before they are thermally activated. Thus, it is possible to sufficiently secure the time during which the gases stay within the process chamber 201, namely the time required in thermally activating the gases.

Furthermore, by performing the confining, the internal pressure (ultimate pressure) of the process chamber 201 can be made higher than that available when not performing the confining. By increasing the internal pressure of the process chamber 201, even under a low temperature condition of, e.g., 150 degrees C. or less, it is possible to sufficiently perform the thermal activation of the TCDMDS gas and the pyridine gas and to sufficiently increase the reaction efficiency of the gases. Particularly, as in the present embodiment, if the supply of the gases into the process chamber 201 is continuously performed without interruption while closing the exhaust system, it becomes easy to increase the internal pressure of the process chamber 201. As a result, it is possible to sufficiently perform the thermal activation of the TCDMDS gas and the pyridine gas.

As described above, by performing the confining of the TCDMDS gas and the pyridine gas in the process chamber 201, it is possible to sufficiently activate the gases and to increase the reaction efficiency of the gases. This makes it possible to accelerate decomposition of the TCDMDS gas and to promote chemisorption of TCDMDS onto the wafer 200, namely formation of the first layer. As a result, it is possible to increase the deposition rate of the SiOC film. Moreover, by performing the confining, it becomes possible to reduce the amount of gases discharged from the interior of the process chamber 201 without contributing to the film forming reaction. That is to say, it is possible to increase the percentage of the gases contributing to the film forming reaction in the gases supplied into the process chamber 201. This makes it possible to reduce the gas cost, namely the film forming cost.

(b) By performing the confining of the TCDMDS gas and the pyridine gas at step 1, as compared with a case where the confining is not performed, it is possible to enhance the controllability of the composition ratio of the SiOC film. Specifically, by performing the confining, it is possible to add C to the film at a high concentration, thereby enabling the film formed on the wafer 200 to become a C-rich SiOC film.

By performing the confining, it is possible to perform the chemisorption of TCDMDS onto the wafer 200 at a high density (densely). That is to say, the first layer (the chemisorption layer of TCDMDS) formed by performing the confining becomes a dense layer which contains TCDMDS molecules having Si—C bonds at a higher density and a larger amount than a layer formed by not performing the confining. Thus, the first layer formed by performing the confining becomes a C-rich layer which is larger in the content of Si—C bonds than a first layer formed by not performing the confining. As a result, a C-rich SiOC film, for example, an SiOC film having a C concentration higher than an O concentration can be formed on the wafer 200.

It has been confirmed that the SiOC film formed by performing the confining is higher in the content of Si—C bonds in the film than an SiOC film formed by not performing the confining. Furthermore, it has been confirmed that the SiOC film formed by performing the confining is higher in the content of Si—C bonds in the film than an SiOC film formed by intermittently supplying a Si source, an O source and a C source to the wafer 200 at a temperature zone of, e.g., 600 to 800 degrees C.

(c) By adjusting the time during which the TCDMDS gas and the pyridine gas are confined in the process chamber 201 at step 1, it is possible to accurately control the composition of the finally-formed SiOC film.

For example, by prolonging the time during which the TCDMDS gas and the pyridine gas are confined in the process chamber 201 at step 1, it is possible to increase the density of TCDMDS chemisorbed onto the wafer 200. As a result, it is possible to increase the amount of TCDMDS included in the first layer, namely the amount of Si—C bonds. This makes it possible to control (finely adjust) the C concentration in the SiOC film in such a direction as to increase the C concentration.

In addition, for example, by shortening the time during which the TCDMDS gas and the pyridine gas are confined in the process chamber 201 at step 1, it is possible to reduce the density of TCDMDS chemisorbed onto the wafer 200. As a result, it is possible to reduce the amount of TCDMDS included in the first layer, namely the amount of Si—C bonds. This makes it possible to control (finely adjust) the C concentration in the SiOC film in such a direction as to reduce the C concentration.

(d) By adjusting the supply amount of the pyridine gas at step 3, it is possible to accurately control the composition of the finally-formed SiOC film.

For example, by reducing the supply amount of the pyridine gas at step 3, it is possible to reduce the oxidizing power of the $H_2O$ gas. Thus, at step 3, it is possible to suppress breakage of Si—C bonds included in the first layer and to reduce the desorption amount of C desorbed from the first layer. As a result, it is possible to control (finely adjust) the C concentration in the SiOC film in such a direction as to increase the C concentration.

In addition, for example, by increasing the supply amount of the pyridine gas at step 3, it is possible to increase the oxidizing power of the $H_2O$ gas. Thus, at step 3, it is possible to increase the amount of O introduced into the second layer. Furthermore, it is possible to promote breakage of Si—C bonds included in the first layer and to slightly increase the desorption amount of C desorbed from the first layer. As a result, it is possible to control (finely adjust) the O concentration in the SiOC film in such a direction as to increase the O concentration and to control (finely adjust) the C concentration in the SiOC film in such a direction as to slightly reduce the C concentration.

(e) By non-simultaneously, i.e., alternately (without synchronization) performing the supply of the TCDMDS gas and the pyridine gas and the supply of the $H_2O$ gas and the pyridine gas, it is possible to cause the gases to appropriately react under a condition in which a surface reaction is dominant. As a result, it is possible to enhance the step coverage of the SiOC film and the film thickness controllability. It is also possible to avoid an excessive gas phase reaction otherwise generated within the process chamber 201 and to suppress generation of particles.

(f) By completely closing the APC valve 244 and closing the exhaust system at step 1, it is possible to extend the lifespan of the APC valve 244. This is because it is not necessary to perform an opening degree adjustment operation of the APC valve 244 in order to control the internal pressure of the process chamber 201 at step 1, which makes it possible to suppress wear of the APC valve 244.

(g) The respective effects described above can be similarly obtained in a case where a gas other than the TCDMDS gas is used as the precursor gas, a case where an O-containing gas other than the $H_2O$ gas is used as the reaction gas, or a case where an amine-based gas or a non-amine-based gas other than the pyridine gas is used as the first catalyst gas or the second catalyst gas. Furthermore, the aforementioned effects can be similarly obtained not only in a case where a gas having the same molecular structure is used as the first catalyst gas and the second catalyst gas but also in a case where gases having different molecular structures are used as the first catalyst gas and the second catalyst gas. For example, the aforementioned effects can be obtained in a case where the pyridine gas is used as the first catalyst gas and where an aminopyridine gas, a picoline gas, a lutidine or the like is used as the second catalyst gas.

(4) Modifications

The film forming sequence according to the present embodiment is not limited to the form illustrated in FIG. 4A and may be modified as in the modifications to be described below.

(Modification 1)

Figure 4B:
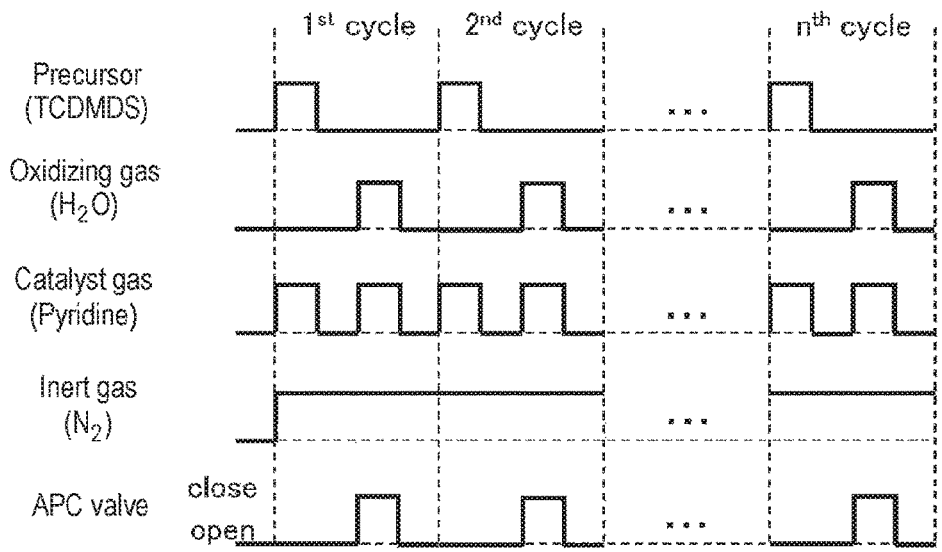
FIG. 4B is a view illustrating a modification of the film forming sequence according to one embodiment of the present disclosure.

As illustrated in FIG. 4B, the confining may not be performed at step 1 of supplying the TCDMDS gas and the pyridine gas and may be performed only at step 3 of supplying the $H_2O$ gas and the pyridine gas. In the present modification, the APC valve 244 is opened at step 1 to perform the evacuation of the interior of the process chamber 201 by the exhaust system. The APC valve 244 is completely closed at step 3 to stop the evacuation of the interior of the process chamber 201 performed by the exhaust system. In addition, the opening/closing control of the valves 243a to 243f at steps 1 and 3 is executed in the same procedure as the opening/closing control of the valves 243a to 243f at steps 1 and 3 of the film forming sequence illustrated in FIG. 4A.

According to the present modification, at step 3, the $H_2O$ gas and the pyridine gas are supplied into the process chamber 201 while closing the exhaust system and are confined in the process chamber 201. Therefore, as compared with a case where the confining is not performed, it is possible to increase the formation rate of the second layer.

By performing the confining, it is possible to prevent the $H_2O$ gas and the pyridine gas supplied into the process chamber 201 from being discharged from the interior of the process chamber 201 before they are thermally activated. Thus, it is possible to sufficiently secure the time during which the gases stay within the process chamber 201, namely the time required in thermally activating the gases. Furthermore, by performing the confining, the internal pressure of the process chamber 201 can be made higher than that available when not performing the confining. By increasing the internal pressure of the process chamber 201, even under a low temperature condition of, e.g., 150 degrees C. or less, it is possible to sufficiently perform the thermal activation of the $H_2O$ gas and the pyridine gas and to sufficiently increase the reaction efficiency of the gases. Particularly, as illustrated in FIG. 4B, if the supply of the gases into the process chamber 201 is continuously performed without interruption while closing the exhaust system, it becomes easy to increase the internal pressure of the process chamber 201. As a result, it is possible to sufficiently perform the thermal activation of the $H_2O$ gas and the pyridine gas.

As described above, by performing the confining of the $H_2O$ gas and the pyridine gas in the process chamber 201, it is possible to sufficiently activate the gases and to increase the reaction efficiency of the gases. This makes it possible to accelerate decomposition of the $H_2O$ gas and to increase the oxidizing power of the $H_2O$ gas. Thus, it is possible to promote oxidization of the first layer, namely formation of the second layer. As a result, it is possible to increase the deposition rate of the SiOC film. Moreover, by performing the confining, it becomes possible to reduce the amount of gases discharged from the interior of the process chamber 201 without contributing to the film forming reaction. That is to say, it is possible to increase the percentage of the gases contributing to the film forming reaction in the gases supplied into the process chamber 201. This makes it possible to reduce the gas cost, namely the film forming cost.

Furthermore, according to the present modification, by performing the confining of the $H_2O$ gas and the pyridine gas at step 3, as compared with a case where the confining is not performed, it is possible to enhance the controllability of the composition ratio of the SiOC film. Specifically, by performing the confining, it is possible to add O to the film at a high concentration, thereby enabling the film formed on the wafer 200 to become an O-rich SiOC film.

By performing the confining as described above, as compared with a case where the confining is not performed, it is possible to accelerate decomposition of the $H_2O$ gas and to increase the oxidizing power of the $H_2O$ gas. This makes it possible to promote the bonding of the Si included in the first layer and the O included in $H_2O$ at step 3. Furthermore, it is possible to promote breakage of Si—C bonds included in the first layer and to increase the desorption amount of C desorbed from the first layer. Moreover, it is possible to bond the Si having a dangling bond as a result of breakage of Si—C bonds and the O included in $H_2O$. This makes it possible to increase the amount of O added to the first layer and to increase the amount of Si—O bonds included in the second layer. As a result, it is possible to adjust the O concentration in the SiOC film in such a direction as to increase the O concentration and to adjust the C concentration in the SiOC film in such a direction as to slightly reduce the C concentration. Thus, the second layer formed by performing the confining becomes an O-rich layer which is larger in O content than a second layer formed by not performing the confining. As a result, it is possible to form an O-rich SiOC film, for example, an SiOC film having an O concentration higher than a C concentration, on the wafer 200.

Furthermore, according to the present modification, by adjusting the time during which the $H_2O$ gas and the pyridine gas are confined in the process chamber 201 at step 3, it is possible to accurately control the composition of the finally-formed SiOC film.

For example, by prolonging the time during which the $H_2O$ gas and the pyridine gas are confined in the process chamber 201 at step 3, it is possible to increase the amount of O added to the first layer. Furthermore, it is possible to promote breakage of Si—C bonds included in the first layer and to slightly increase the desorption amount of C desorbed from the first layer. As a result, it is possible to control (finely adjust) the O concentration in the SiOC film in such a direction as to increase the O concentration and to control (finely adjust) the C concentration in the SiOC film in such a direction as to slightly reduce the C concentration.

In addition, for example, by shortening the time during which the $H_2O$ gas and the pyridine gas are confined in the process chamber 201 at step 3, it is possible to reduce the amount of O added to the first layer. It is also possible to suppress breakage of Si—C bonds included in the first layer and to reduce the desorption amount of C desorbed from the first layer. As a result, it is possible to control the C concentration in the SiOC film in such a direction as to suppress reduction in the C concentration.

For the sake of convenience, the film forming sequence of the present modification may sometimes be indicated as follows.

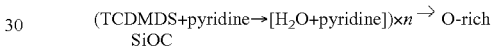

(Modification 2)

Figure 4C:
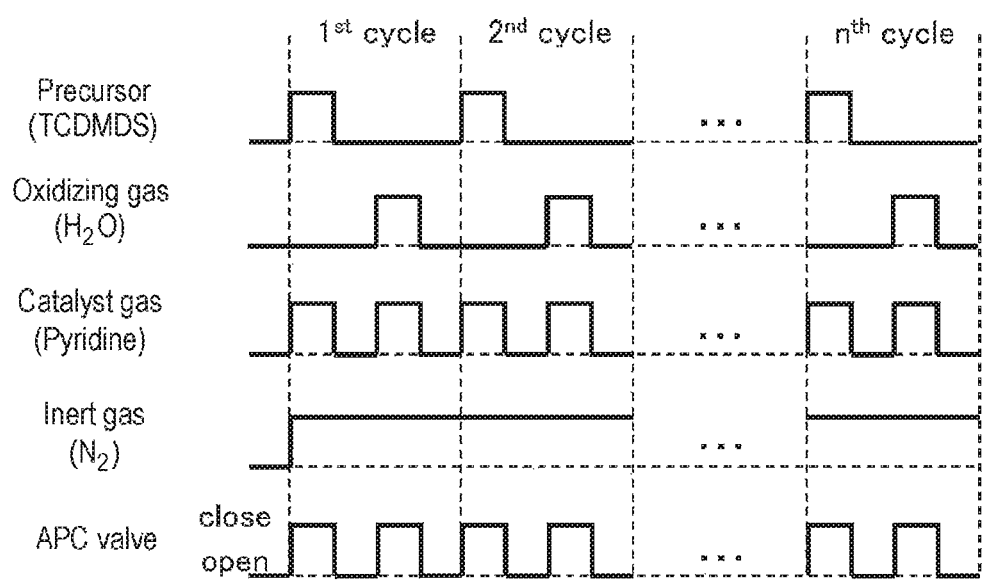
FIG. 4C is a view illustrating another modification of the film forming sequence according to one embodiment of the present disclosure.

As illustrated in FIG. 4C, the confining may be performed at step 1 of supplying the TCDMDS gas and the pyridine gas and may also be performed at step 3 of supplying the $H_2O$ gas and the pyridine gas. In the present modification, the APC valve 244 is completely closed at steps 1 and 3 to stop the evacuation of the interior of the process chamber 201 performed by the exhaust system. The opening/closing control of the valves 243a to 243f at steps 1 and 3 is executed in the same procedure as the opening/closing control of the valves 243a to 243f at steps 1 and 3 of the film forming sequence illustrated in FIG. 4A.

In the present modification, the same effects as those of the film forming sequences illustrated in FIGS. 4A and 4B are obtained.

Furthermore, according to the present modification, it is possible to increase the formation rate of the first layer and the formation rate of the second layer because the confining is performed at steps 1 and 3. As a result, it is possible to further increase the deposition rate of the SiOC film. By performing the confining at both steps, it is possible to further reduce the amount of gases discharged from the interior of the process chamber 201 without contributing to the film forming reaction and to further reduce the gas cost, namely the film forming cost.

Moreover, according to the present modification, by adjusting the time during which the confining is performed at steps 1 and 3, it is possible to broadly control the composition of the SiOC film.

For example, if the time during which the TCDMDS gas and the pyridine gas are confined in the process chamber 201 at step 1 is set to become longer than the time during which the $H_2O$ gas and the pyridine gas are confined in the process chamber 201 at step 3, it is possible to form a C-rich SiOC film, for example, an SiOC film having a C concentration higher than an O concentration.

Moreover, for example, if the time during which the TCDMDS gas and the pyridine gas are confined in the process chamber 201 at step 1 is set to become shorter than the time during which the H₂O gas and the pyridine gas are confined in the process chamber 201 at step 3, it is possible to form an O-rich SiOC film, for example, an SiOC film having an O concentration higher than a C concentration.

In addition, for example, if the time during which the TCDMDS gas and the pyridine gas are confined in the process chamber 201 at step 1 is set to become substantially equal to the time during which the H₂O gas and the pyridine gas are confined in the process chamber 201 at step 3, it is possible to form a C-rich SiOC film, an O-rich SiOC film or a C-rich and O-rich SiOC film. For example, it is possible to form an SiOC film having an O concentration equal to a C concentration.

For the sake of convenience, the film forming sequence of the present modification may sometimes be indicated as follows.

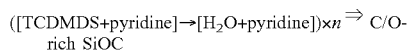
rich SiOC (Modification 3)

Figure 5A:
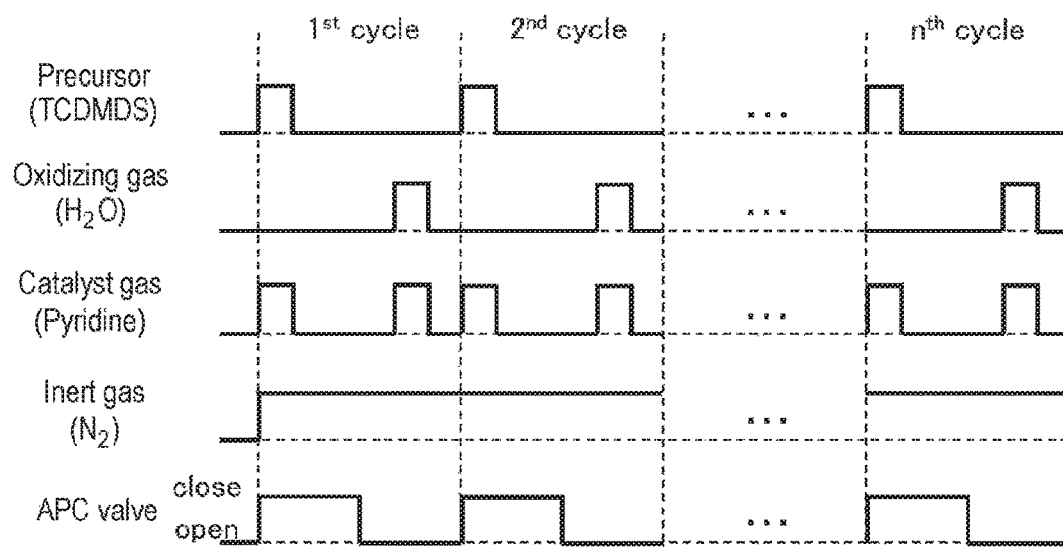
FIG. 5A is a view illustrating another modification of the film forming sequence according to one embodiment of the present disclosure.

As illustrated in FIG. 5A, at step 1, the supply of the TCDMDS gas and the pyridine gas may be performed only at an initial stage of a closing period of the exhaust system.

That is to say, at step 1, it may be possible to perform a sub step of supplying and confining the TCDMDS gas and the pyridine gas in the process chamber 201 while completely closing the APC valve 244 and a sub step of stopping the supply of the TCDMDS gas and the pyridine gas into the process chamber 201 and keeping the TCDMDS gas and the pyridine gas confined in the process chamber 201.

Figure 5B:
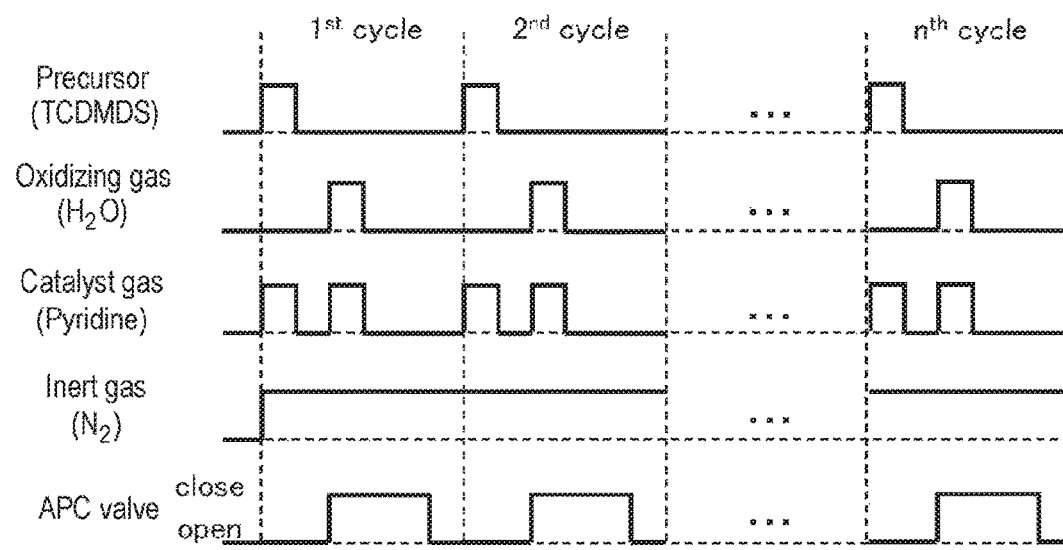
FIG. 5B is a view illustrating another modification of the film forming sequence according to one embodiment of the present disclosure.

Furthermore, as illustrated in FIG. 5B, at step 3, the supply of the H₂O gas and the pyridine gas may be performed only at an initial stage of a closing period of the exhaust system.

That is to say, at step 3, it may be possible to perform a sub step of supplying and confining the H₂O gas and the pyridine gas into the process chamber 201 while completely closing the APC valve 244 and a sub step of stopping the supply of the H₂O gas and the pyridine gas into the process chamber 201 and keeping the H₂O gas and the pyridine gas confined in the process chamber 201.

According to the present modification, the same effects as those of the film forming sequence illustrated in FIG. 4A are obtained. Furthermore, according to the present modification, it is possible to further reduce the amount of gases discharged from the interior of the process chamber 201 without contributing to the film forming reaction and to further reduce the gas cost, namely the film forming cost.

(Modification 4)

An SiOC film (stack film) may be formed on the wafer 200 by combining the film forming sequence illustrated in FIG. 4A and the aforementioned modifications and by laminating two films differing in chemical composition from each other.

Figure 6B:
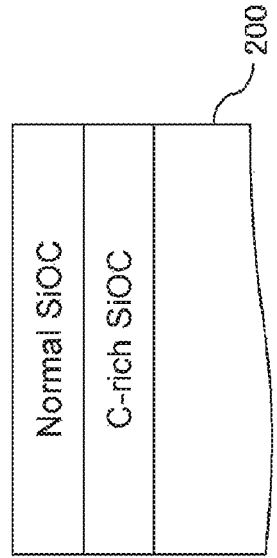
FIG. 6B is a view illustrating another example of the stack film.
Figure 6D:
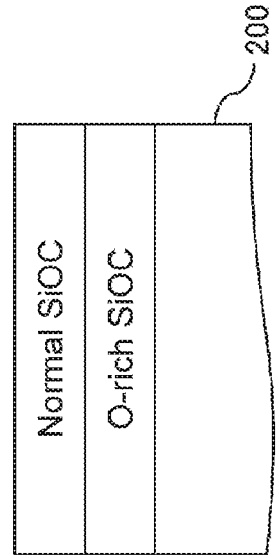
FIG. 6D is a view illustrating another example of the stack film.
Figure 6A:
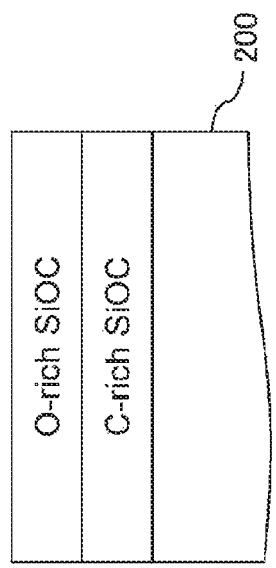
FIG. 6A is a view illustrating one example of a stack film.

For example, an SiOC film (C-rich SiOC film) may be formed by the film forming sequence illustrated in FIG. 4A and then an SiOC film (O-rich SiOC film) may be formed by the film forming sequence illustrated in FIG. 4B. FIG. 6A illustrates a cross-sectional structure of a stack film formed according to the present modification.

Furthermore, for example, an SiOC film (C-rich SiOC film) may be formed by the film forming sequence illustrated in FIG. 4A and then an SiOC film (normal SiOC film) may be formed by the film forming sequence in which the confining of gases in the process chamber 201 is not performed at steps 1 and 3. FIG. 6B illustrates a cross-sectional structure of a stack film formed according to the present modification.

Figure 6C:
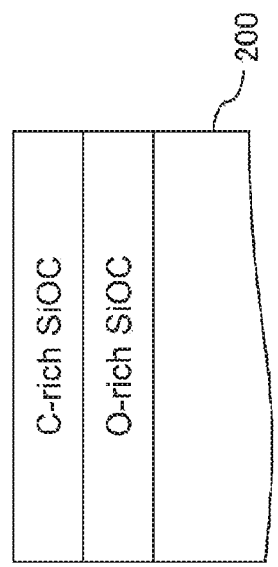
FIG. 6C is a view illustrating another example of the stack film.

Moreover, for example, an SiOC film (O-rich SiOC film) may be formed by the film forming sequence illustrated in FIG. 4B and then an SiOC film (C-rich SiOC film) may be formed by the film forming sequence illustrated in FIG. 4A. FIG. 6C illustrates a cross-sectional structure of a stack film formed according to the present modification.

In addition, for example, an SiOC film (O-rich SiOC film) may be formed by the film forming sequence illustrated in FIG. 4B and then an SiOC film (normal SiOC film) may be formed by the film forming sequence in which the confining of gases in the process chamber 201 is not performed at steps 1 and 3. FIG. 6D illustrates a cross-sectional structure of a stack film formed according to the present modification.

According to the present modification, the same effects as those of the film forming sequence illustrated in FIG. 4A and the aforementioned modifications are obtained.

Furthermore, according to the present modification, it is possible to form a film in which at least one of a C concentration and an O concentration in a finally-formed SiOC film (stack film) differs in a film thickness direction (lamination direction). That is to say, it is possible to form a film in which at least one of a C concentration and an O concentration in a finally-formed SiOC film varies stepwise from a bottom surface side of the film toward a top surface side thereof.

Moreover, if the composition is changed so as to increase the C concentration at the top surface side of the film, it is possible to improve the etching resistance, namely the processing characteristics of the film. A film having a relatively high in-film C concentration tends to become higher in resistance to HF or the like than a film having a relatively low in-film C concentration.

In addition, if the composition is changed so as to increase the O concentration (reduce the C concentration) at the top surface side of the film, it is possible to improve the surface roughness of the film. As used herein, the term "surface roughness" means the height difference in a wafer surface or in an arbitrary object surface. The surface roughness has the same meaning as the surface coarseness. By stating that the surface roughness is improved, it is meant that the height difference is reduced, namely that the surface is smoothened. By stating that the surface roughness is worsened, it is meant that the height difference is increased, namely that the surface is roughened. There is a tendency that a film having a relatively low in-film C concentration becomes better in surface roughness than a film having a relatively high in-film C concentration.

The film forming sequences implemented in an early period and a late period when performing the cycle a predetermined number of times are not limited to the aforementioned examples but may be selected, in arbitrary combinations, from the film forming sequences illustrated in FIGS. 4A to 4C. In this case, similar to some of the aforementioned modifications, the confining may be performed in at least one of the early period and the late period when performing the cycle a predetermined number of times and may not be performed in the other.

(Modification 5)

An SiOC film (stack film) may be formed on the wafer 200 by combining the film forming sequence illustrated in FIG. 4A and the aforementioned modifications and by laminating three films differing in composition from one another.

Figure 7B:
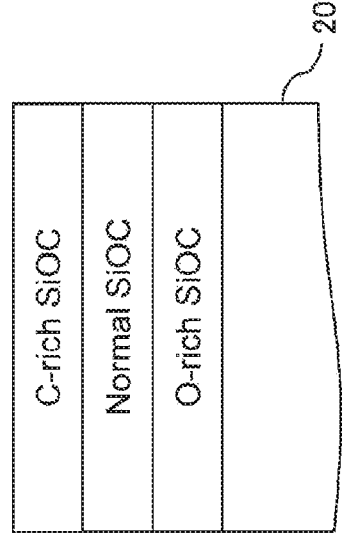
FIG. 7B is a view illustrating another example of the stack film.
Figure 7D:
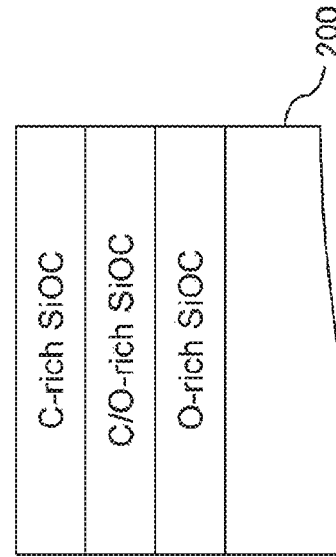
FIG. 7D is a view illustrating another example of the stack film.
Figure 7A:
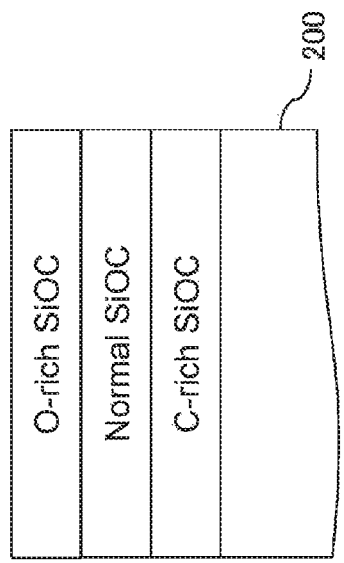
FIG. 7A is a view illustrating another example of the stack film.

For example, an SiOC film (C-rich SiOC film) may be formed by the film forming sequence illustrated in FIG. 4A, an SiOC film (normal SiOC film) may be formed by the film forming sequence in which the confining of gases in the process chamber 201 is not performed at steps 1 and 3, and then an SiOC film (O-rich SiOC film) may be formed by the film forming sequence illustrated in FIG. 4B. FIG. 7A illustrates a cross-sectional structure of a stack film formed according to the present modification.

Furthermore, for example, an SiOC film (O-rich SiOC film) may be formed by the film forming sequence illustrated in FIG. 4B, an SiOC film (normal SiOC film) may be formed by the film forming sequence in which the confining of gases in the process chamber 201 is not performed at steps 1 and 3, and then an SiOC film (C-rich SiOC film) may be formed by the film forming sequence illustrated in FIG. 4A. FIG. 7B illustrates a cross-sectional structure of a stack film formed according to the present modification.

Figure 7C:
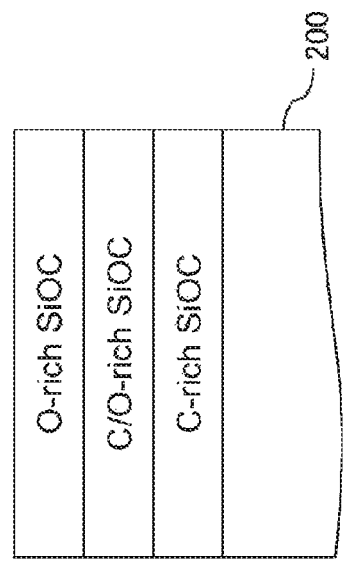
FIG. 7C is a view illustrating another example of the stack film.

Moreover, for example, an SiOC film (C-rich SiOC film) may be formed by the film forming sequence illustrated in FIG. 4A, an SiOC film (C/O-rich SiOC film) may be formed by the film forming sequence illustrated in FIG. 4C, and then an SiOC film (O-rich SiOC film) may be formed by the film forming sequence illustrated in FIG. 4B. FIG. 7C illustrates a cross-sectional structure of a stack film formed according to the present modification.

In addition, for example, an SiOC film (O-rich SiOC film) may be formed by the film forming sequence illustrated in FIG. 4B, an SiOC film (C/O-rich SiOC film) may be formed by the film forming sequence illustrated in FIG. 4C, and then an SiOC film (C-rich SiOC film) may be formed by the film forming sequence illustrated in FIG. 4A. FIG. 7D illustrates a cross-sectional structure of a stack film formed according to the present modification.

According to the present modification, the same effects as those of the film forming sequence illustrated in FIG. 4A and the aforementioned modifications are obtained.

Furthermore, according to the present modification, it is possible to form a film in which at least one of a C concentration and an O concentration in a finally-formed SiOC film (stack film) differs in a film thickness direction (lamination direction). That is to say, it is possible to form a film in which at least one of a C concentration and an O concentration in a finally-formed SiOC film varies stepwise from a bottom surface side of the film toward a top surface side thereof. As described above, if the composition is changed so as to increase the C concentration at the top surface side of the film, it is possible to improve the etching resistance, namely the processing characteristics of the film. In addition, if the composition is changed so as to increase the O concentration (reduce the C concentration) at the top surface side of the film, it is possible to improve the surface roughness of the film.

The film forming sequences implemented in an early period and a late period when performing the cycle a predetermined number of times are not limited to the aforementioned examples but may be selected, in arbitrary combinations, from the film forming sequences illustrated in FIGS. 4A to 4C. In this case, similar to some of the aforementioned modifications, the confining may be performed in at least one of the early period and the late period when performing the cycle a predetermined number of times and may not be performed in the other.

(Modification 6)

An SiOC film (nano laminate film) may be formed on the wafer 200 by combining the film forming sequence illustrated in FIG. 4A and the aforementioned modifications and by laminating a plurality of films, which differ in composition from one another, at a nano level thickness.

For example, a first cycle in which the TCDMDS gas and the pyridine gas are supplied and confined in the process chamber 201 while closing the exhaust system at the step of forming the first layer and in which the $H_2O$ gas and the pyridine gas are supplied into the process chamber 201 while opening the exhaust system at the step of forming the second layer, and a second cycle in which the TCDMDS gas and the pyridine gas are supplied into the process chamber 201 while opening the exhaust system at the step of forming the first layer and in which the $H_2O$ gas and the pyridine gas are supplied and confined in the process chamber 201 while closing the exhaust system at the step of forming the second layer, may be alternately implemented (or repeated).

Furthermore, for example, the TCDMDS gas and the pyridine gas may be supplied and confined in the process chamber 201 while closing the exhaust system at the step of forming the first layer, the $H_2O$ gas and the pyridine gas may be supplied and confined in the process chamber 201 while closing the exhaust system at the step of forming the second layer, and a first cycle in which the time during which the TCDMDS gas and the pyridine gas are confined in the process chamber 201 is set longer than the time during which the $H_2O$ gas and the pyridine gas are confined in the process chamber 201 and a second cycle in which the time during which the TCDMDS gas and the pyridine gas are confined in the process chamber 201 is set shorter than the time during which the $H_2O$ gas and the pyridine gas are confined in the process chamber 201 may be alternately implemented (or repeated).

According to the present modification, the same effects as those of the film forming sequence illustrated in FIG. 4A and the aforementioned modifications are obtained.

Furthermore, according to the present modification, it is possible to form a nano laminate film in which the C-rich SiOC film (first film) formed in the first cycle and the O-rich SiOC film (second film) formed in the second cycle are alternately laminated at a nano level.

The thickness of each of the films that constitute the nano laminate film may be 0.1 nm or more and 5 nm or less, specifically 0.1 nm or more and 3 nm or less, more specifically 0.1 nm or more and 1 nm or less.

It is difficult to set the thickness of each of the first film and the second film at a thickness of less than 0.1 nm. Furthermore, if the thickness of one of the first film and the second film is set at a thickness of more than 5 nm, there may be a case where the finally-formed SiOC film becomes a film having non-uniform (inconsistent) characteristics in the lamination direction, namely a film whose characteristics are made distinct in the lamination direction due to the mere lamination of the first film and the second film. By setting the thickness of each of the first film and the second film at a thickness which falls within the aforementioned range, it is possible to have the finally-formed SiOC film become a film having consistent characteristics in the lamination direction, namely a film in which the characteristics and properties of the first film and the second film are properly fused. By setting the thickness of each of the first film and the second film at a thickness of 3 nm or less, it is possible to obtain a laminated film in which the characteristics and properties of the first film and the second film are sufficiently fused. By setting the thickness of each of the first film and the second film at a thickness of 1 nm or less, it is possible to obtain a laminated film in which the characteristics and properties of the first film and the second film are surely fused. That is to say, by setting the thickness of the first film and the second film at a thickness which falls within the aforementioned range, it is possible to have the finally-formed SiOC film become a nano laminate film having integral and inseparable characteristics in the film as a whole. In addition, if the number of times of implementing each of the first cycle and the second cycle is set at once or more and 50 times or less, specifically once or more and 30 times or less, more specifically once or more and 10 times or less, it is possible to set the thickness of each of the first film and the second film at a thickness which falls within the aforementioned range. In addition, if the thickness of each of the first film and the second film is set to become smaller, it is possible to improve the surface roughness of the finally-formed SiOC film.

Moreover, according to the present modification, it is possible to form a film in which at least one of a C concentration and an O concentration in a finally-formed SiOC film (nano laminate film) differs in a film thickness direction (lamination direction). That is to say, it is possible to form a film in which at least one of a C concentration and an O concentration in a finally-formed SiOC film varies stepwise or continuously from a bottom surface side of the film toward a top surface side thereof.

Figure 8A:
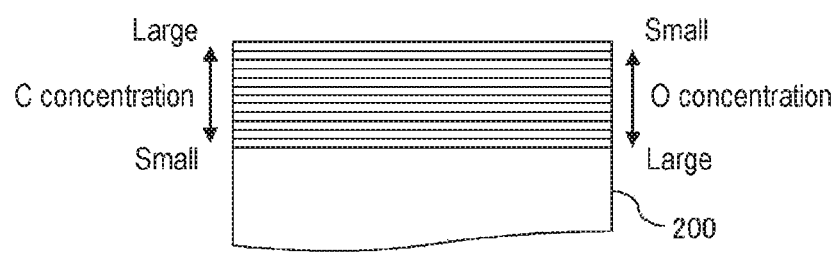
FIG. 8A is a view illustrating one example of a nano laminate film.

For example, when forming the nano laminate film, as illustrated in FIG. 8A, the C concentration may be set to become small and the O concentration may be set to become large at the bottom surface side of the film. The C concentration may be set to become large and the O concentration may be set to become small at the top surface side of the film. In this case, the C concentration and the O concentration may be gradually or smoothly changed between the bottom surface and the top surface of the film. That is to say, at least one of the C concentration and the O concentration may have a gradation in the film thickness direction.

Figure 8B:
FIG. 8B is a view illustrating another example of the nano laminate film.

Furthermore, for example, when forming the nano laminate film, as illustrated in FIG. 8B, the C concentration may be set to become large and the O concentration may be set to become small at the bottom surface side of the film. The C concentration may be set to become small and the O concentration may be set to become large at the top surface side of the film. In this case, the C concentration and the O concentration may be gradually or smoothly changed between the bottom surface and the top surface of the film. That is to say, at least one of the C concentration and the O concentration may have a gradation in the film thickness direction.

As described above, if the composition is changed so as to increase the C concentration at the top surface side of the nano laminate film, it is possible to improve the etching resistance, namely the processing characteristics of the film. In addition, if the composition is changed so as to increase the O concentration (reduce the C concentration) at the top surface side of the film, it is possible to improve the surface roughness of the film.

The film forming sequences implemented when forming the respective films that constitute the nano laminate film may be selected, in arbitrary combinations, from the film forming sequences illustrated in FIGS. 4A to 4C. In this case, specific films among the films that constitute the nano laminate film may be formed by performing the confining and other films may be formed without performing the confining.

(Modification 7)

As the precursor gas, an alkylene halosilane precursor gas such as a BTCSM gas or the like may be used instead of the alkyl halosilane precursor gas such as the TCDMDS gas or the like.

According to the present modification, the same effects as those of the film forming sequence illustrated in FIG. 4A and the aforementioned modifications are obtained. Furthermore, by using, as the precursor gas, the alkylene halosilane precursor gas not having a Si—Si bond but having a Si—C—Si bond in which C is interposed between Si and Si, it is possible to further increase the C concentration in the SiOC film. The reason is that C included in the alkylene halosilane precursor gas is bonded to Si and Si at two bonds. Thus, when forming the first layer, it is possible to suppress breakage of all the bonds of C and Si included in the precursor gas and resultant non-introduction of C into the first layer. Moreover, when modifying the first layer into the second layer, it is possible to suppress breakage of all the bonds of C and Si included in the first layer and resultant desorption of C from the first layer. That is to say, by using the precursor gas having a Si—C—Si bond, such as an alkylene halosilane precursor gas or the like, it becomes possible to make the in-film C concentration higher than that available when using a precursor gas not having a bond in which C is interposed between Si and Si.

(Modification 8)

As in the film forming sequences illustrated below, a C-free halosilane precursor gas such as an HCDS gas or the like, namely a halosilane precursor gas not containing a Si—C bond, may be used as the precursor gas. At step 1 of supplying an HCDS gas and a pyridine gas into the process chamber 201, a silicon-containing layer which includes Cl but does not include C (a Si-containing layer including Cl) is formed as a first layer. At step 3 of supplying an H$_2$O gas and a pyridine gas into the process chamber 201, a C-free silicon oxide layer (SiO layer) is formed as a second layer. As a result, a C-free silicon oxide layer (SiO layer) is formed on the wafer 200.

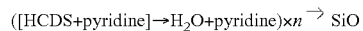

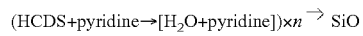

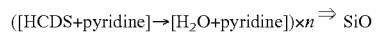

According to these film forming sequences, the same effects as those of the embodiment and the modifications described above are obtained. That is to say, by performing the confining of gases in the process chamber 201 in at least one of steps 1 to 3, it is possible to increase the formation rate of the first layer or the second layer. As a result, it becomes possible to increase the deposition rate of the SiO film. It is also possible to increase the controllability of the composition ratio of the SiO film.

Other Embodiments of the Present Disclosure

While one embodiment of the present disclosure has been specifically described above, the present disclosure is not limited to the aforementioned embodiment but may be differently modified without departing from the spirit of the present disclosure.

In the aforementioned embodiment, there has been described an example where the reaction gas and the second catalyst gas are supplied after supplying the precursor gas and the first catalyst gas. The present disclosure is not limited to this form. The supply order may be reversed. That is to say, the precursor gas and the first catalyst gas may be supplied after supplying the reaction gas and the second catalyst gas. By changing the supply order, it becomes possible to change the quality and composition ratio of the film as formed.

In the aforementioned embodiment, when closing the exhaust system, the APC valve 244 may not be completely closed but may be slightly opened. In this case, the gases may be exhausted from the interior of the process chamber 201 while supplying the gases into the process chamber 201. At this time, it may be possible to maintain a state in which the exhaust rate of the gases exhausted from the interior of the process chamber 201 is smaller than the supply rate of the gases supplied into the process chamber 201. By doing so, it is possible to slightly form a gas flow moving from the interior of the process chamber 201 toward the exhaust pipe 231. This makes it possible to remove the reaction byproducts generated within the process chamber 201 and to improve the quality of the film forming process. In the subject specification, the closing state of the exhaust system may include not only a case where the APC valve 244 is completely closed but also a case where the APC valve 244 is slightly opened.

In the aforementioned embodiment, there has been described an example where the second catalyst gas and the thermally activated reaction gas are used when modifying the first layer to the second layer, namely an example where the second catalyst gas and the reaction gas are supplied under a non-plasma atmosphere when modifying the first layer to the second layer. The present disclosure is not limited to this form. A plasma-excited reaction gas may be supplied. That is to say, the reaction gas may be supplied under a plasma atmosphere. At this time, the processing conditions may be similar to, e.g., the processing conditions of the aforementioned embodiment.

In the aforementioned embodiment, there has been described an example where a Si-based oxide film such as an SiOC film, an SiO film or the like is formed by using an oxidizing gas such as an $H_2O$ gas or the like as the reaction gas. The present disclosure is not limited to this form. For example, instead of the oxidizing gas, a nitriding gas including an N—H bond may be used as the reaction gas to nitride the first layer into the second layer, thereby forming a Si-based nitride film such as an SiCN film, an SiN film or the like. Alternatively, a Si-based oxynitride film such as an SiON film, an SiOCN film or the like may be formed by using a combination of an oxidizing gas, a nitriding gas and the like as the reaction gas. As the nitriding gas, it may be possible to use, for example, an $NH_3$ gas, a diazene ($N_2H_2$) gas, a hydrazine ($N_2H_4$) gas, an $N_3H_8$ gas, or a gas including these compounds. At this time, the processing conditions may be similar to, e.g., the processing conditions of the aforementioned embodiment.

In the aforementioned embodiment, there has been described an example where a chlorosilane precursor gas is used as the precursor gas for use in forming the SiOC film or the SiO film. The present disclosure is not limited to this form. A halosilane precursor gas other than the chlorosilane precursor gas, for example, a fluorosilane precursor gas or a bromosilane precursor gas, may be used as the precursor gas. At this time, the processing conditions may be similar to, e.g., the processing conditions of the aforementioned embodiment.

If the silicon-based insulation film formed by the method of the aforementioned embodiment is used as a sidewall spacer, it is possible to provide a technique of forming a device which is small in leak current and superior in workability. If the aforementioned silicon-based insulation film is used as an etching stopper, it is possible to provide a technique of forming a device which is superior in workability. Furthermore, according to the aforementioned embodiment, it is possible to form a silicon-based insulation film having an ideal stoichiometric ratio without having to use plasma. Since the silicon-based insulation film can be formed without having to use plasma, it is possible to adapt the present disclosure to a process for forming, e.g., an SADP film of a DPT, in which plasma damage is about a concern.

The aforementioned film forming sequences may be suitably applied to a case where an oxide film containing a metal element such as titanium (Ti), zirconium (Zr), hafnium (Hf), tantalum (Ta), niobium (Nb), aluminum (Al), molybdenum (Mo), tungsten (W) or the like, namely a metal-based oxide film, is formed on the wafer 200. That is to say, the aforementioned film forming sequences may be suitably applied to a case where a TiOC film, a TiO film, a TiOCN film, a TiON film, a ZrOC film, a ZrO film, a ZrOCN film, a ZrON film, an HfOC film, an HfO film, an HfOCN film, an HfON film, a TaOC film, a TaO film, a TaOCN film, a TaON film, an NbOC film, an NbO film, an NbOCN film, an NbON film, an AlOC film, an AlO film, an AlOCN film, an AlON film, an MoOC film, an MoO film, an MoOCN film, an MoON film, a WOC film, a WO film, a WOCN film, or a WON film is formed on the wafer 200.

In the case of forming the metal-based oxide film, as the precursor gas, it may be possible to use, e.g., an inorganic metal precursor gas containing a metal element and a halogen element, such as a titanium tetrachloride ($TiCl_4$) gas, a titanium tetrafluoride ($TiF_4$) gas, a zirconium tetrachloride ($ZrCl_4$) gas, a zirconium tetrafluoride ($ZrF_4$) gas, a hafnium tetrachloride ($HfCl_4$) gas, a hafnium tetrafluoride ($HfF_4$) gas, a tantalum pentachloride ($TaCl_5$) gas, a tantalum pentafluoride ($TaF_5$) gas, a niobium pentachloride ($NbCl_5$) gas, a niobium pentafluoride ($NbF_5$) gas, an aluminum trichloride ($AlCl_3$) gas, an aluminum trifluoride ($AlF_3$) gas, a molybdenum pentachloride ($MoCl_5$) gas, a molybdenum pentafluoride ($MoF_5$) gas, a tungsten hexachloride ($WCl_6$) gas, a tungsten hexafluoride ($WF_6$) gas, or the like. Alternatively, as the precursor gas, it may be possible to use, e.g., an organic metal precursor gas containing a metal element and carbon (containing a chemical bond of a metal element and carbon), such as a trimethyl aluminum ($Al(CH_3)_3$, abbreviation: TMA) gas or the like. As the reaction gas, the first catalyst gas and the second catalyst gas, it may be possible to use gases similar to those used in the aforementioned embodiment.

At this time, the processing procedures and the processing conditions may be similar to, e.g., the processing procedures and the processing conditions of the aforementioned embodiment. Even in these cases, the same effects as those of the embodiment and the modifications described above are obtained.

That is to say, the present disclosure may be suitably applied to a case where an oxide film including a semiconductor element or a metal element is formed.

Recipes (e.g., programs describing processing procedures and processing conditions) used in processing substrates may be prepared individually according to the processing contents (e.g., the kind, composition ratio, quality, film thickness, processing procedure and processing condition of the film to be formed) and may be stored in the memory device 121c via a telecommunication line or the external memory device 123. Moreover, at the start of the substrate processing, the CPU 121a may properly select an appropriate recipe from the recipes stored in the memory device 121c according to the processing contents. This configuration enables a single substrate processing apparatus to form films of different kinds, composition ratios, qualities and thicknesses with enhanced reproducibility. In addition, this configuration makes it possible to reduce an operator's burden (e.g., a burden borne by an operator when inputting processing procedures and processing conditions) and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch type substrate processing apparatus capable of processing a plurality of substrates at a time. The present disclosure is not limited to the aforementioned embodiment but may be suitably applied to, e.g., a case where films are formed using a single-substrate-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be suitably applied to a case where films are formed using a substrate processing apparatus provided with a cold-wall-type processing furnace.

Figure 13:
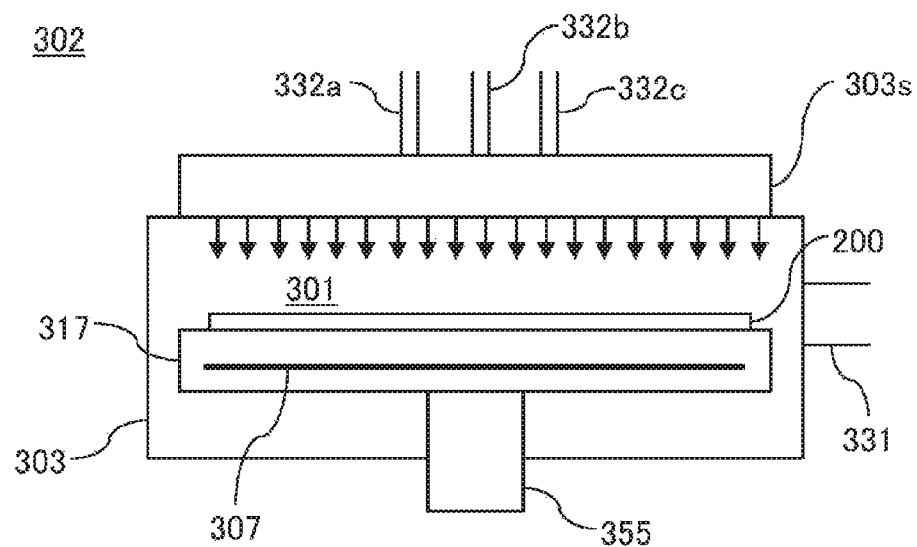
FIG. 13 is a schematic configuration view of a processing furnace of a substrate processing apparatus suitably used in another embodiment of the present disclosure, in which a portion of the processing furnace is shown in a vertical cross section.

The present disclosure may be suitably applied to, e.g., a case where a film is formed using a substrate processing apparatus provided with a processing furnace 302 illustrated in FIG. 13. The processing furnace 302 includes a process vessel 303 which defines a process chamber 301, a shower head 303s configured to supply gases into the process chamber 301 in a shower-like manner, a support table 317 configured to horizontally support one or more wafers 200, a rotary shaft 355 configured to support the support table 317 from below, and a heater 307 installed in the support table 317. A gas supply port 332a configured to supply the aforementioned precursor gas, a gas supply port 332b configured to the supply the aforementioned reaction gas and a gas supply port 332c configured to supply the aforementioned first and second catalyst gases are connected to inlets (gas introduction holes) of the shower head 303s. A gas supply system similar to the precursor gas supply system of the aforementioned embodiment is connected to the gas supply port 332a. A gas supply system similar to the reaction gas supply system of the aforementioned embodiment is connected to the gas supply port 332b. A gas supply system similar to the catalyst gas supply system of the aforementioned embodiment is connected to the gas supply port 332c. A gas distribution plate configured to supply gases into the process chamber 301 in a shower-like manner is installed in outlets (gas discharge holes) of the shower head 303s. An exhaust port 331 configured to evacuate the interior of the process chamber 301 is installed in the process vessel 303. An exhaust system similar to the exhaust system of the aforementioned embodiment is connected to the exhaust port 331.

Figure 14:
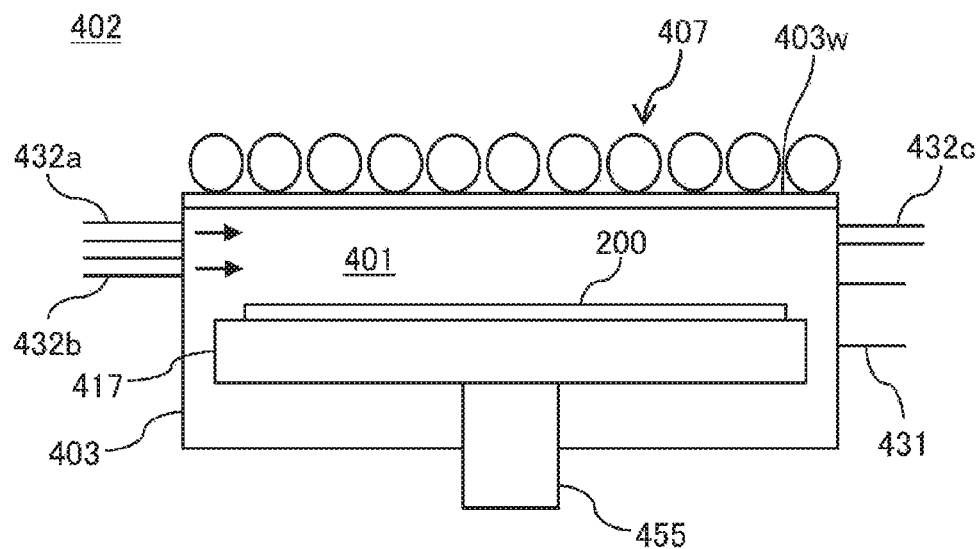
FIG. 14 is a schematic configuration view of a processing furnace of a substrate processing apparatus suitably used in a further embodiment of the present disclosure, in which a portion of the processing furnace is shown in a vertical cross section.

In addition, the present disclosure may be suitably applied to, e.g., a case where a film is formed using a substrate processing apparatus provided with a processing furnace 402 illustrated in FIG. 14. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed within the process vessel 403, and a quartz window 403w which transmits the light irradiated from the lamp heater 407. A gas supply port 432a configured to supply the aforementioned precursor gas, a gas supply port 432b configured to supply the aforementioned reaction gas and a gas supply port 432c configured to supply the aforementioned first and second catalyst gases are connected to the process vessel 403. A gas supply system similar to the precursor gas supply system of the aforementioned embodiment is connected to the gas supply port 432a. A gas supply system similar to the reaction gas supply system of the aforementioned embodiment is connected to the gas supply port 432b. A gas supply system similar to the catalyst gas supply system of the aforementioned embodiment is connected to the gas supply port 432c. An exhaust port 431 configured to evacuate the interior of the process chamber 401 is installed in the process vessel 403. An exhaust system similar to the exhaust system of the aforementioned embodiment is connected to the exhaust port 431.

In the case of using these substrate processing apparatuses, a film forming process may be performed by the sequences and processing conditions similar to those of the embodiments described above.

The embodiments and modifications described above may be appropriately combined with one another. In addition, the processing conditions used at this time may be similar to, e.g., the processing conditions of the embodiments and modifications described above.

<Aspects of the Present Disclosure>

Hereinafter, some aspects of the present disclosure will be additionally described as supplementary notes.

(Supplementary Note 1)

According to one aspect of the present disclosure, there is provided a method of manufacturing a semiconductor device or a substrate processing method, including forming a film including a first element, a second element and carbon on a substrate by performing a cycle a predetermined number of times, the cycle including non-simultaneously performing:

forming a first layer by supplying a precursor gas including a chemical bond of the first element and carbon and a first catalyst gas to the substrate in a process chamber;

exhausting the precursor gas and the first catalyst gas in the process chamber through an exhaust system;

forming a second layer by supplying a reaction gas including the second element and a second catalyst gas to the substrate in the process chamber to modify the first layer; and exhausting the reaction gas and the second catalyst gas in the process chamber through the exhaust system, wherein at least in a specific cycle when performing the cycle the predetermined number of times, the respective gases are supplied and confined in the process chamber while closing the exhaust system in at least one of the act of forming the first layer and the act of forming the second layer.

(Supplementary Note 2)

In the method of Supplementary Note 1, in the specific cycle, the precursor gas and the first catalyst gas may be supplied and confined in the process chamber while closing the exhaust system in the act of forming the first layer. Thus, it is possible to make the concentration of carbon in the first layer (the film) higher than that available when not performing the confining.

(Supplementary Note 3)

In the method of Supplementary Note 2, a concentration of carbon in the first layer (the film) may be finely adjusted by adjusting the time during which the precursor gas and the first catalyst gas are confined in the process chamber.

(Supplementary Note 4)

In the method of any one of Supplementary Notes 1 to 3, in the specific cycle, the reaction gas and the second catalyst gas may be supplied and confined in the process chamber while closing the exhaust system in the act of forming the second layer. Thus, it is possible to make the concentration of the second element in the second layer (the film) higher than that available when not performing the confining. Furthermore, it is possible to make the concentration of carbon in the second layer (the film) lower than that available when not performing the confining.

(Supplementary Note 5)

In the method of Supplementary Note 4, at least one of a concentration of the second element and a concentration of carbon in the second layer (the film) may be finely adjusted by adjusting the time during which the reaction gas and the second catalyst gas are confined in the process chamber.

(Supplementary Note 6)

In the method of Supplementary Note 4, the time during which the precursor gas and the first catalyst gas are confined in the process chamber may be set to become longer than the time during which the reaction gas and the second catalyst gas are confined in the process chamber. Thus, it is possible to form the film in which carbon is rich.

(Supplementary Note 7)

In the method of Supplementary Note 4, the time during which the precursor gas and the first catalyst gas are confined in the process chamber may be set to become shorter than the time during which the reaction gas and the second catalyst gas are confined in the process chamber. That is to say, the time during which the reaction gas and the second catalyst gas are confined in the process chamber may be set to become longer than the time during which the precursor gas and the first catalyst gas are confined in the process chamber. Thus, it is possible to form the film in which the second element is rich.

(Supplementary Note 8)

In the method of any one of Supplementary Notes 1 to 7, the specific cycle may be performed in at least one of an early period, a middle period and a late period when performing the cycle the predetermined number of times.

(Supplementary Note 9)

In the method of any one of Supplementary Notes 1 to 8, in a cycle other than the specific cycle, the confining may not be performed. That is to say, in a cycle other than the specific cycle, the respective gases may be supplied into the process chamber while opening the exhaust system.

(Supplementary Note 10)

In the method of any one of Supplementary Notes 1 to 9, at least one of a concentration of carbon and a concentration of the second element in the film may vary in a thickness direction of the film.

(Supplementary Note 11)

In the method of any one of Supplementary Notes 1 to 10, at least one of a concentration of carbon and a concentration of the second element in the film may be changed stepwise or continuously from a bottom surface side of the film toward a top surface side of the film.

(Supplementary Note 12)

In the method of any one of Supplementary Notes 1 to 10, in the act of forming the film, a first cycle in which the confining is performed in the act of forming the first layer and the confining is not performed in the act of forming the second layer, and a second cycle in which the confining is not performed in the act of forming the first layer and the confining is performed in the act of forming the second layer may be alternately performed (repeated).

Thus, it is possible to form a laminated film (nano laminate film) in which a carbon-rich first film including the first element, the second element and carbon and a second-element-rich second film including the first element, the second element and carbon are laminated (alternately at a nano level).

(Supplementary Note 13)

In the method of any one of Supplementary Notes 1 to 10, in the act of forming the film, the confining may be performed in the act of forming the first layer and the act of forming the second layer, and a first cycle in which the confining time in the act of forming the first layer is set to become longer than the confining time in the act of forming the second layer and a second cycle in which the confining time in the act of forming the first layer is set to become shorter than the confining time in the act of forming the second layer may be alternately performed (repeated).

Thus, it is possible to form a laminated film (nano laminate film) in which a carbon-rich first film including the first element, the second element and carbon and a second-element-rich second film including the first element, the second element and carbon are laminated (alternately at a nano level).

(Supplementary Note 14)

In the method of any one of Supplementary Notes 1 to 13, the precursor gas may further include a halogen element, and the reaction gas may further include hydrogen (a chemical bond of the second element and hydrogen).

Furthermore, the first element may include a semiconductor element or a metal element, and the second element may include oxygen.

Moreover, the first catalyst gas may have the same molecular structure (chemical structure) as the second catalyst gas. That is to say, the first catalyst gas is identical in material with the second catalyst gas.

(Supplementary Note 15)

According to another aspect of the present disclosure, there is provided a substrate processing apparatus, including:

a process chamber configured to accommodate a substrate;

a precursor gas supply system configured to supply a precursor gas including a chemical bond of a first element and carbon to the substrate in the process chamber;

a reaction gas supply system configured to supply a reaction gas including a second element to the substrate in the process chamber;

a catalyst gas supply system configured to supply a first catalyst gas and a second catalyst gas to the substrate in the process chamber;

an exhaust system configured to evacuate an interior of the process chamber; and a control part configured to control the precursor gas supply system, the reaction gas supply system, the catalyst gas supply system and the exhaust system so as to perform a process of forming a film including the first element, the second element and carbon on the substrate by performing a cycle a predetermined number of times, the cycle including non-simultaneously performing:

forming a first layer by supplying the precursor gas and the first catalyst gas to the substrate in the process chamber;

exhausting the precursor gas and the first catalyst gas in the process chamber through the exhaust system;

forming a second layer by supplying the reaction gas and the second catalyst gas to the substrate in the process chamber to modify the first layer; and exhausting the reaction gas and the second catalyst gas in the process chamber through the exhaust system, wherein at least in a specific cycle when performing the cycle the predetermined number of times, the respective gases are supplied and confined in the process chamber while closing the exhaust system in at least one of the act of forming the first layer and the act of forming the second layer.

(Supplementary Note 16)

According to a further aspect of the present disclosure, there is provided a non-transitory computer-readable recording medium storing a program that causes a computer to perform a process of forming a film including a first element, a second element and carbon on a substrate by performing a cycle a predetermined number of times, the cycle including non-simultaneously performing:

forming a first layer by supplying a precursor gas including a chemical bond of the first element and carbon and a first catalyst gas to the substrate in a process chamber;

exhausting the precursor gas and the first catalyst gas in the process chamber through an exhaust system;

forming a second layer by supplying a reaction gas including the second element and a second catalyst gas to the substrate in the process chamber to modify the first layer; and exhausting the reaction gas and the second catalyst gas in the process chamber through the exhaust system, wherein at least in a specific cycle when performing the cycle the predetermined number of times, the respective gases are supplied and confined in the process chamber while closing the exhaust system in at least one of the act of forming the first layer and the act of forming the second layer.

According to the present disclosure in some embodiments, it is possible to enhance the productivity of a film forming process and to improve the controllability of a composition ratio of a formed film when a film is formed on a substrate using a precursor gas and a reaction gas.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a film including a first element, a second element and carbon on a substrate by performing a cycle a predetermined number of times, the cycle including non-simultaneously performing:

forming a first layer by supplying a precursor gas including a chemical bond of the first element and carbon and a first catalyst gas to the substrate in a process chamber;

exhausting the precursor gas and the first catalyst gas in the process chamber through an exhaust system;

forming a second layer by supplying a reaction gas including the second element and a second catalyst gas to the substrate in the process chamber to modify the first layer; and exhausting the reaction gas and the second catalyst gas in the process chamber through the exhaust system, wherein the precursor gas and the first catalyst gas supplied to the substrate are confined in the process chamber while closing the exhaust system in the act of forming the first layer, and wherein a concentration of carbon in the film is finely adjusted by adjusting a time during which the precursor gas and the first catalyst gas are confined in the process chamber.

2. The method of claim 1, wherein the precursor gas further includes a halogen element, and the reaction gas further includes hydrogen.

3. The method of claim 1, wherein the first element includes a semiconductor element or a metal element, and the second element includes oxygen.

4. The method of claim 1, wherein the first catalyst gas has the same molecular structure as the second catalyst gas.

5. A method of manufacturing a semiconductor device, comprising forming a film including a first element, a second element and carbon on a substrate by performing a cycle a predetermined number of times, the cycle including non-simultaneously performing:

forming a first layer by supplying a precursor gas including a chemical bond of the first element and carbon and a first catalyst gas to the substrate in a process chamber;

exhausting the precursor gas and the first catalyst gas in the process chamber through an exhaust system;

forming a second layer by supplying a reaction gas including the second element and a second catalyst gas to the substrate in the process chamber to modify the first layer; and exhausting the reaction gas and the second catalyst gas in the process chamber through the exhaust system, wherein the reaction gas and the second catalyst gas supplied to the substrate are confined in the process chamber while closing the exhaust system in the act of forming the second layer.

6. The method of claim 5, wherein a concentration of carbon in the film is finely adjusted by adjusting a time during which the reaction gas and the second catalyst gas are confined in the process chamber.

7. The method of claim 5, wherein the precursor gas and the first catalyst gas supplied to the substrate are not confined in the process chamber in the act of forming the first layer.

8. A method of manufacturing a semiconductor device, comprising forming a film including a first element, a second element and carbon on a substrate by performing a cycle a predetermined number of times, the cycle including non-simultaneously performing:

forming a first layer by supplying a precursor gas including a chemical bond of the first element and carbon and a first catalyst gas to the substrate in a process chamber;

exhausting the precursor gas and the first catalyst gas in the process chamber through an exhaust system;

forming a second layer by supplying a reaction gas including the second element and a second catalyst gas to the substrate in the process chamber to modify the first layer; and exhausting the reaction gas and the second catalyst gas in the process chamber through the exhaust system, wherein the precursor gas and the first catalyst gas supplied to the substrate are confined in the process chamber while closing the exhaust system in the act of forming the first layer, and wherein the reaction gas and the second catalyst gas supplied to the substrate are confined in the process chamber while closing the exhaust system in the act of forming the second layer.

9. The method of claim 8, wherein a time during which the precursor gas and the first catalyst gas are confined in the process chamber is set to become longer than a time during which the reaction gas and the second catalyst gas are confined in the process chamber.

10. The method of claim 8, wherein a time during which the precursor gas and the first catalyst gas are confined in the process chamber is set to become shorter than a time during which the reaction gas and the second catalyst gas are confined in the process chamber.

11. A method of manufacturing a semiconductor device, comprising forming a film including a first element, a second element and carbon on a substrate by performing a cycle a predetermined number of times, the cycle including non-simultaneously performing:

forming a first layer by supplying a precursor gas including a chemical bond of the first element and carbon and a first catalyst gas to the substrate in a process chamber;

exhausting the precursor gas and the first catalyst gas in the process chamber through an exhaust system;

forming a second layer by supplying a reaction gas including the second element and a second catalyst gas to the substrate in the process chamber to modify the first layer; and exhausting the reaction gas and the second catalyst gas in the process chamber through the exhaust system, wherein the precursor gas and the first catalyst gas supplied to the substrate are confined in the process chamber while closing the exhaust system in the act of forming the first layer, and wherein the reaction gas and the second catalyst gas supplied to the substrate are not confined in the process chamber in the act of forming the second layer.

12. A non-transitory computer-readable recording medium storing a program that causes a computer to perform a process of forming a film including a first element, a second element and carbon on a substrate by performing a cycle a predetermined number of times, the cycle including non-simultaneously performing:

forming a first layer by supplying a precursor gas including a chemical bond of the first element and carbon and a first catalyst gas to the substrate in a process chamber;

exhausting the precursor gas and the first catalyst gas in the process chamber through an exhaust system;

forming a second layer by supplying a reaction gas including the second element and a second catalyst gas to the substrate in the process chamber to modify the first layer; and exhausting the reaction gas and the second catalyst gas in the process chamber through the exhaust system, wherein the precursor gas and the first catalyst gas supplied to the substrate are confined in the process chamber while closing the exhaust system in the act of forming the first layer, and wherein a concentration of carbon in the film is finely adjusted by adjusting a time during which the precursor gas and the first catalyst gas are confined in the process chamber.

* * * * *